United States Patent
He

(10) Patent No.: US 10,142,635 B2
(45) Date of Patent: Nov. 27, 2018

(54) ADAPTIVE BINARIZER SELECTION FOR IMAGE AND VIDEO CODING

(71) Applicant: BlackBerry Limited, Waterloo (CA)

(72) Inventor: Dake He, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 14/974,691

(22) Filed: Dec. 18, 2015

(65) Prior Publication Data

US 2017/0180732 A1 Jun. 22, 2017

(51) Int. Cl.

| | |
|---|---|
| *H04N 19/13* | (2014.01) |
| *H04N 19/44* | (2014.01) |
| *H04N 19/96* | (2014.01) |
| *H04N 19/14* | (2014.01) |
| *H04N 19/184* | (2014.01) |
| *H04N 19/176* | (2014.01) |
| *H04N 19/70* | (2014.01) |
| *H03M 7/40* | (2006.01) |
| *H04N 19/91* | (2014.01) |

(52) U.S. Cl.
CPC .......... *H04N 19/13* (2014.11); *H03M 7/4018* (2013.01); *H04N 19/14* (2014.11); *H04N 19/184* (2014.11); *H04N 19/44* (2014.11); *H04N 19/70* (2014.11); *H04N 19/91* (2014.11); *H04N 19/96* (2014.11)

(58) Field of Classification Search
CPC ...... H04N 19/13; H04N 19/14; H04N 19/184; H04N 19/44; H04N 19/70; H04N 19/91; H04N 19/96; H03M 7/4018
USPC ................................................... 375/240.02
See application file for complete search history.

(56) References Cited

U.S. PATENT DOCUMENTS

| | | | | |
|---|---|---|---|---|
| 2007/0046504 | A1* | 3/2007 | Ridge | ................. H04N 19/176 341/50 |
| 2013/0223528 | A1* | 8/2013 | Lim | ..................... H04N 19/91 375/240.12 |
| 2013/0300591 | A1* | 11/2013 | Marpe | .................... H03M 7/40 341/67 |

FOREIGN PATENT DOCUMENTS

| | | |
|---|---|---|
| EP | 2557792 A1 | 2/2013 |
| WO | 2011125314 A1 | 10/2011 |

OTHER PUBLICATIONS

A. Aaron and M. Watson, "Netflix on future video coding," ISO/IEC JTC 1/SC 29/WG11 m35771, Geneva, CH, 2015.
D. Marpe, H. Schwarz and T. Weigand, "Context-based adaptive binary arithmetic coding in the H.264/AVC video compression standard," IEEE Trans. Circuits and Systems for Video Technology, vol. 13, No. 7, p. 620-636, 2003.

(Continued)

*Primary Examiner* — Hee-Yong Kim
(74) *Attorney, Agent, or Firm* — Rowand LLP

(57) ABSTRACT

Methods and devices for image and video coding using arithmetic coding. The binarization of symbols in an encoder and decoder is adaptive based on changes to the probability distribution as symbols are encoded/decoded. A binarizer may be generated based upon a probability distribution, used to binarize a symbol, and then the probability distribution is updated based on the symbol. Updates to the binarizer may be made after each symbol, after a threshold number of symbols, or once the updated probability distribution differs by more than a threshold amount from the probability distribution used in generating the current binarizer. The probability distributions may be context-specific.

20 Claims, 13 Drawing Sheets

(56) References Cited

OTHER PUBLICATIONS

E.-h. Yang and Y. Jia, "Universal lossless coding of sources with large and unbounded alphabets," in Numbers, Information and Complexity, Springer, 2000, pp. 421-442.
R. M. Neal, I. H. Witten and J. G. Cleary, "Arithmetic coding for data compression," Communications of the ACM, vol. 30, No. 6, pp. 520-540, 1987.
R. G. Gallager, "Variations on a theme by Huffman," IEEE Trans. Info. Theory, vol. 24, No. 6, pp. 668-674, 1978.
J. S. Vitter, "Design and analysis of dynamic Huffman codes," J. of ACM, vol. 34, No. 4, pp. 825-845, 1987.
EPO, Extended European Search Report relating to European application No. 16202896.3, dated May 31, 2017.
EPO, Communication Pursuant to Article 94(3) EPC, relating to EP application No. 16202896.3 dated May 14, 2018.

\* cited by examiner

ADAPTIVE BINARIZER SELECTION FOR IMAGE AND VIDEO CODING

FIELD

The present application generally relates to data compression and, in particular, to methods and devices for adaptive binarizer selection in image and video coding.

BACKGROUND

Data compression is used in communications and computer networking to store, transmit, and reproduce information efficiently. It finds particular application in the encoding of images, audio and video. Common image compression formats include JPEG, TIFF, and PNG. A newly-developed video coding standard is the ITU-T H.265/HEVC standard. Other video coding formats include the VP8 and VP9 formats developed by Google Inc. Evolutions to all of these standards and formats are under active development.

All of these image and video coding standards and formats are based on predictive coding that create a prediction of data to be coded, then encode the error in the prediction (often called the residual) for transmission to a decoder as a bitstream. The decoder then makes the same prediction and adjusts it by the reconstructed error decoded from the bitstream. The lossless data compression of the error at the encoder often includes a spectral transform of the error to create blocks of transform domain coefficients. This is typically accompanied by lossy quantization. The reverse operations are performed at the decoder to reconstruct the error/residual. In many coding schemes, this data, plus side information for making the predictions (e.g. intra-coding mode or inter-coding motion vectors) is usually encoded using binary arithmetic coding (BAC). This means that the non-binary portions of the data (termed "symbols" herein) may need to be binarized to create a stream of binary data for the BAC engine to encode. In some encoders/decoders, multi-level arithmetic coders may be used instead of binary arithmetic coders, in which case the binarizer is embedded within the multi-level arithmetic coder.

In existing coding schemes, the binarizer is prescribed by the standard. For example, in H.265/HEVC, the binarization scheme (CABAC) is very closely integrated with the context modeling. In VP8/VP9, the binarization of "tokens" (symbols that signal the magnitude of quantized coefficients) is carried out using a pre-defined coding tree.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1A:
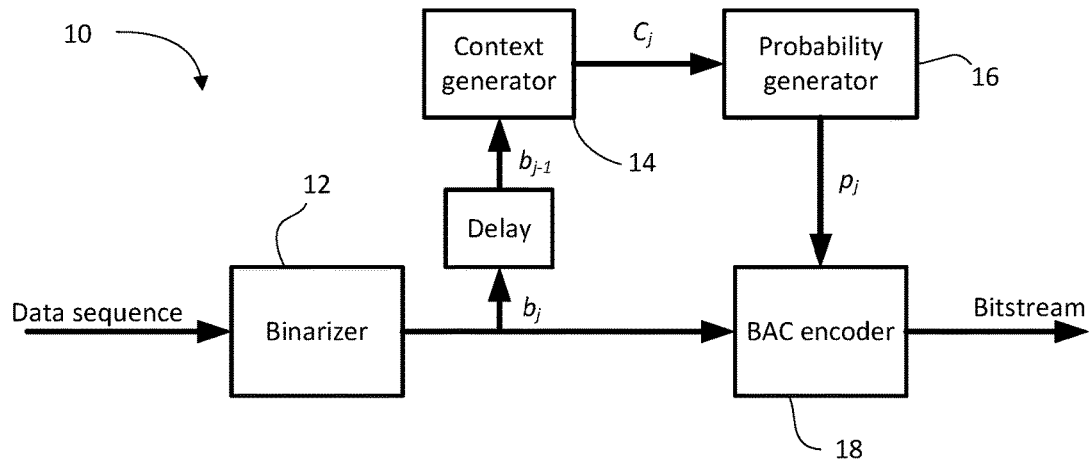
FIG. 1A shows, in simplified block diagram form, an encoder for encoding video using a binarizer and a binary arithmetic encoder.

The present application describes methods and encoders/decoders for encoding and decoding images and/or video.

In a first aspect, the present application describes a method of decoding an image in a video or image decoder from a bitstream, the bitstream having header information for a set of blocks, the decoder having an arithmetic decoder to convert the bitstream into a sequence of bins, the decoder having a default binarizer to transform bins into symbols. The method includes obtaining the header information from the bitstream; determining from the header information that a modified binarizer is to be used, instead of the default binarizer, with respect to a sequence of bins for the set of blocks; and reconstructing a sequence of symbols from the sequence of bins using the modified binarizer to inverse binarize the sequence of bins.

In another aspect, the present application describes a method of encoding an image within an image or video encoder to generate a bitstream of encoded data, the image having a set of blocks, the encoder having an arithmetic encoder to convert bins into the bitstream of encoded data, the encoder having a default binarizer to transform symbols into bins. The method includes determining, for the set of blocks, that a modified binarizer is to be used, instead of the default binarizer, to binarize a sequence of symbols within that set of blocks; binarizing the sequence of symbols using the modified binarizer to generate a sequence of bins; arithmetically encoding the sequence of bins using the arithmetic encoder to generate the bitstream of encoded data; and inserting header information in the bitstream that indicates that the modified binarizer is to be used, instead of the default binarizer, with respect to the sequence of bins.

In yet another aspect, the present application describes a method of decoding an image in a video or image decoder from a bitstream, the decoder having an arithmetic decoder to convert the bitstream into bins, and the decoder having a binarizer constructed based on a probability distribution associated with an alphabet of symbols. The method includes inverse binarizing, using the binarizer, a sequence of bins arithmetically decoded from the bitstream and corresponding to an encoded symbol from the alphabet of symbols, to produce a reconstructed symbol; updating the probability distribution based on the reconstructed symbol to produce an updated probability distribution; and determining an updated binarizer based on the updated probability distribution for use in inverse binarizing a second sequence of symbols to produce a second reconstructed symbol.

In a further aspect, the present application describes a method of encoding an image within an image or video encoder to generate a bitstream of encoded data, the encoder having an arithmetic encoder to convert bins into the bitstream of encoded data, and the encoder having a binarizer constructed based on a probability distribution associated with an alphabet of symbols. The method includes binarizing, using the binarizer, a symbol from the image to produce a sequence of bins; arithmetically encoding the sequence of bins to generate the bitstream; updating the probability distribution based on the symbol to produce an updated probability distribution; and determining an updated binarizer based on the updated probability distribution for use in binarizing a second symbol to produce a second sequence of bins.

In a further aspect, the present application describes encoders and decoders configured to implement such methods of encoding and decoding.

In yet a further aspect, the present application describes non-transitory computer-readable media storing computer-executable program instructions which, when executed, configured a processor to perform the described methods of encoding and/or decoding.

Other aspects and features of the present application will be understood by those of ordinary skill in the art from a review of the following description of examples in conjunction with the accompanying figures.

It will be understood that some aspects of the present application are not limited to either image or video coding and may be applied to general data compression in some embodiments.

In the description that follows, some example embodiments are described with reference to the H.264/AVC standard for video coding, the H.265/HEVC standard, the VP8 format, the VP9 format, or others. Those ordinarily skilled in the art will understand that the present application is not limited to those video coding standards and formats but may be applicable to other video coding/decoding standards and formats, including possible future standards, multi-view coding standards, scalable video coding standards, 3D video coding standards, and reconfigurable video coding standards. Similarly, to the extent that reference is made to particular image coding standards and formats, it will be appreciated that the processes and devices described may be implemented in connection with other standards, including future standards In the description that follows, when referring to video or images the terms frame, picture, slice, tile, quantization group, and rectangular slice group may be used somewhat interchangeably. Those of skill in the art will appreciate that a picture or frame may contain one or more slices or segments. A series of frames/pictures may be called a "sequence" in some cases. Other terms may be used in other video or image coding standards. It will also be appreciated that certain encoding/decoding operations might be performed on a frame-by-frame basis, some are performed on a slice-by-slice basis, some picture-by-picture, some tile-by-tile, and some by rectangular slice group, etc., depending on the particular requirements or terminology of the applicable image or video coding standard. In any particular embodiment, the applicable image or video coding standard may determine whether the operations described below are performed in connection with frames and/or slices and/or pictures and/or tiles and/or rectangular slice groups, etc., as the case may be. Accordingly, those ordinarily skilled in the art will understand, in light of the present disclosure, whether particular operations or processes described herein and particular references to frames, slices, pictures, tiles, rectangular slice groups are applicable to frames, slices, pictures, tiles, rectangular slice groups, or some or all of those for a given embodiment. This also applies to coding tree units, coding units, prediction units, transform units, quantization groups, etc., as will become apparent in light of the description below.

In the description below, example embodiments are described that involve an example binarizer from VP8 and VP9, specifically a coding tree for tokens. It will be appreciated that tokens in VP8 and VP9 are one example of a "symbol", and that the present application is not limited to "tokens". It will also be appreciated that while example implementations of the present application may involve VP8, VP9 or evolutions of that format, it is not limited to such coding schemes. It will also be appreciated that the present application may be applicable to binarizers other than coding trees and other than the specific coding trees described herein.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

Reference is now made to FIG. 1A, which shows, in simplified block diagram form, an encoder 10 for encoding video. This example encoder involves binarization before context modeling. In other words, the context is determined for binarized bins rather than for pre-binarization symbols of an incoming data sequence.

The encoder 10 includes a binarizer 12 that converts an incoming data sequence of symbols (which may include data that has been generated through other coding manipulations, including spectral transforms, quantization, predictive operations, etc.) into a sequence of bins, $b_1, b_2, \ldots b_{j-1}, b_j, \ldots$.

The encoder 10 further includes a context generator 14. In order to encode bin $b_j$ the context generator 14 determines a context $C_j$ from the encoded history, e.g., $b_{j-1} b_{j-2} \ldots$ and available side information (e.g. the position of $b_j$ in a transform block). A probability generator 16 then determines $p_j$ from $C_j$ and the encoded history $b_{j-1}b_{j-2}\ldots$, e.g. the encoded binary symbols that appear under the same context $C_j$.

A binary arithmetic coding (BAC) encoder 18 encodes $b_j$ based on the determined probability $p_j$ given the context $C_j$ for $b_j$. The BAC encoder 18 outputs a bitstream of arithmetically encoded data. In other words, the BAC encoder 18 relies upon a probability that is specific to a determined context for the bin being encoded. In some embodiments, such as H.265/HEVC for example, the binarization is closely related to the context model. For example, H.265/HEVC prescribes the binarization of quantized transform coefficients into a sign bit, a significant-coefficient flag, a greater-than-one flag, etc. Each of these binary syntax elements may have its own defined context model for determining context and, thus, the probability associated with that syntax element for coding by the BAC (which is context-adaptive in the case of H.265/HEVC).

Figure 2A:
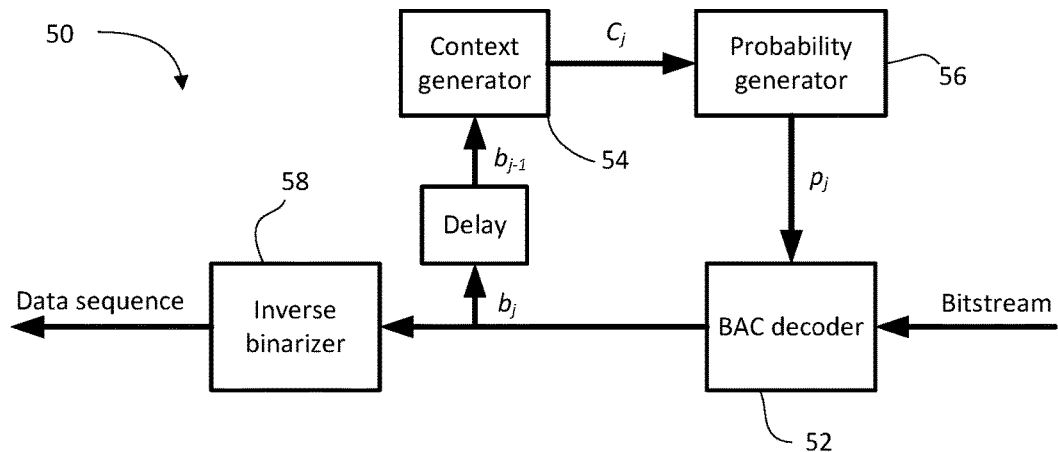
FIG. 2A shows, in simplified block diagram form, a decoder for decoding video using an inverse binarizer and a binary arithmetic decoder.

FIG. 2A shows, in simplified block diagram form, an example decoder 50 that corresponds to the example encoder 10 of FIG. 1A. The example decoder 50 includes a BAC decoder 52. The BAC decoder 52 receives a probability $p_j$ for decoding the bitstream. The probability $p_j$ is provided by a probability generator 56 and is specific to a context $C_j$ specified by a context generator 54. It will be understood that the context modelling, the determination of context, and the probability determinations are the same as carried out in the corresponding encoder 10 so as to enable the decoder 50 to decode the bitstream accurately. An inverse binarizer 58 reconstructs the sequence of symbols based on the decoded sequence of bins output by the BAC decoder 52.

The present application may also be applicable in the case of multi-level arithmetic coding (MAC). This type of coding deals with sequences formed of symbols from an alphabet whose cardinality is greater than 2. In MAC, a binary search tree is used to represent A, where each symbol in A corresponds to a unique leaf in the binary search tree. As such, to encode and decode a symbol a in A, one encodes and decodes the path consisting of branches from the root to the leaf corresponding to a. Note that a convention may be adopted to label the left branch "0" and the right branch "1" or any other convention to label the branches with elements in {0, 1}. Observe that the binary search tree representation of alphabet A is part of MAC. As such, MAC can be used together with context models designed for the original sequence.

Figure 3A:
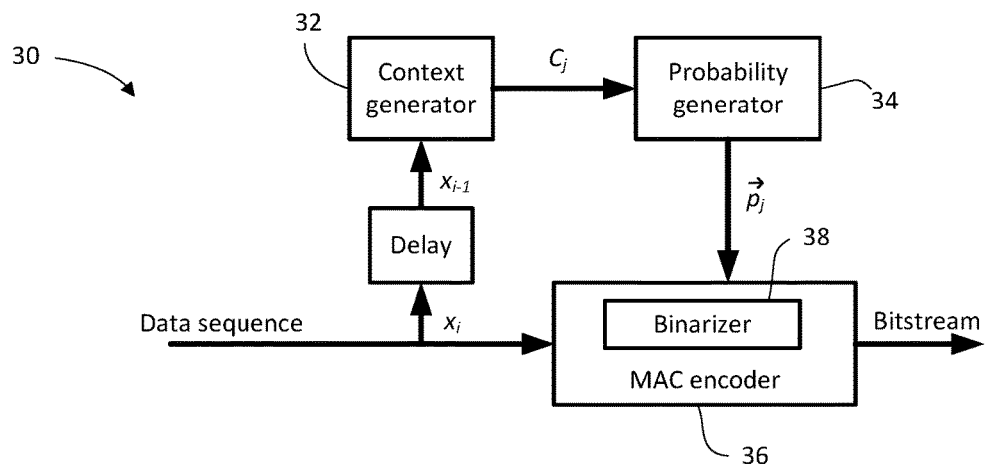
FIG. 3A shows, in simplified block diagram form, an encoder for encoding video using a binarizer and a multi-level arithmetic encoder.

Reference is now made to FIG. 3A, which shows, in simplified block diagram form, an encoder 30 for encoding video. The encoder 30 includes a context generator 32 for determining context in accordance with a context model, and a probability generator 34 for determining the probability(ies) associated with a given context. This example encoder 30 involves binarization after context modeling. In other words, the context is determined for pre-binarization symbols of an incoming data sequence, and the sequence is then binarized within a MAC encoder 36, which includes, as a part of it, a binarizer 38. In some embodiments, the binarizer 38 may take the form of a binary search tree for converting a symbol to a binary string given the context determined for the symbol.

Figure 4A:
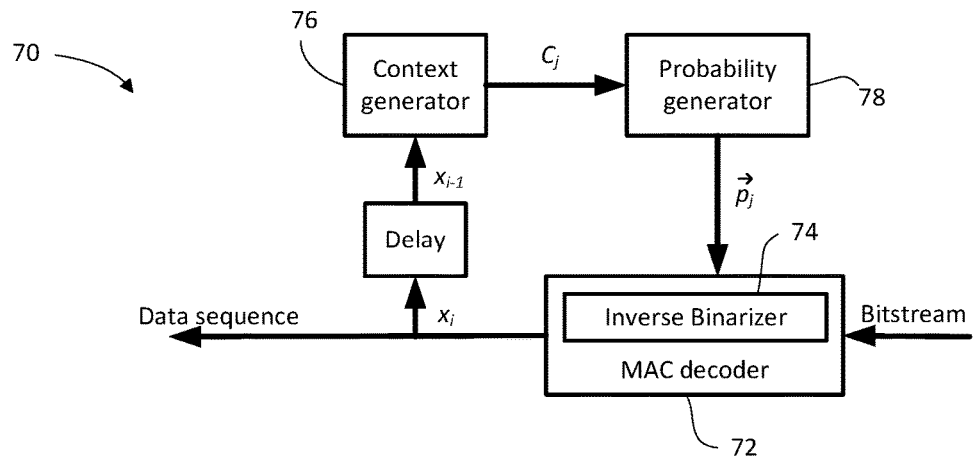
FIG. 4A shows, in simplified block diagram form, a decoder for decoding video using an inverse binarizer and a multi-level arithmetic decoder.

A corresponding simplified block diagram of a decoder 70 is shown in FIG. 4A. The decoder 70 includes a MAC decoder 72 with integrated inverse binarizer 74, and receives probability information for decoding the incoming bitstream of encoded data from a context generator 76 and probability generator 78.

Figure 5:
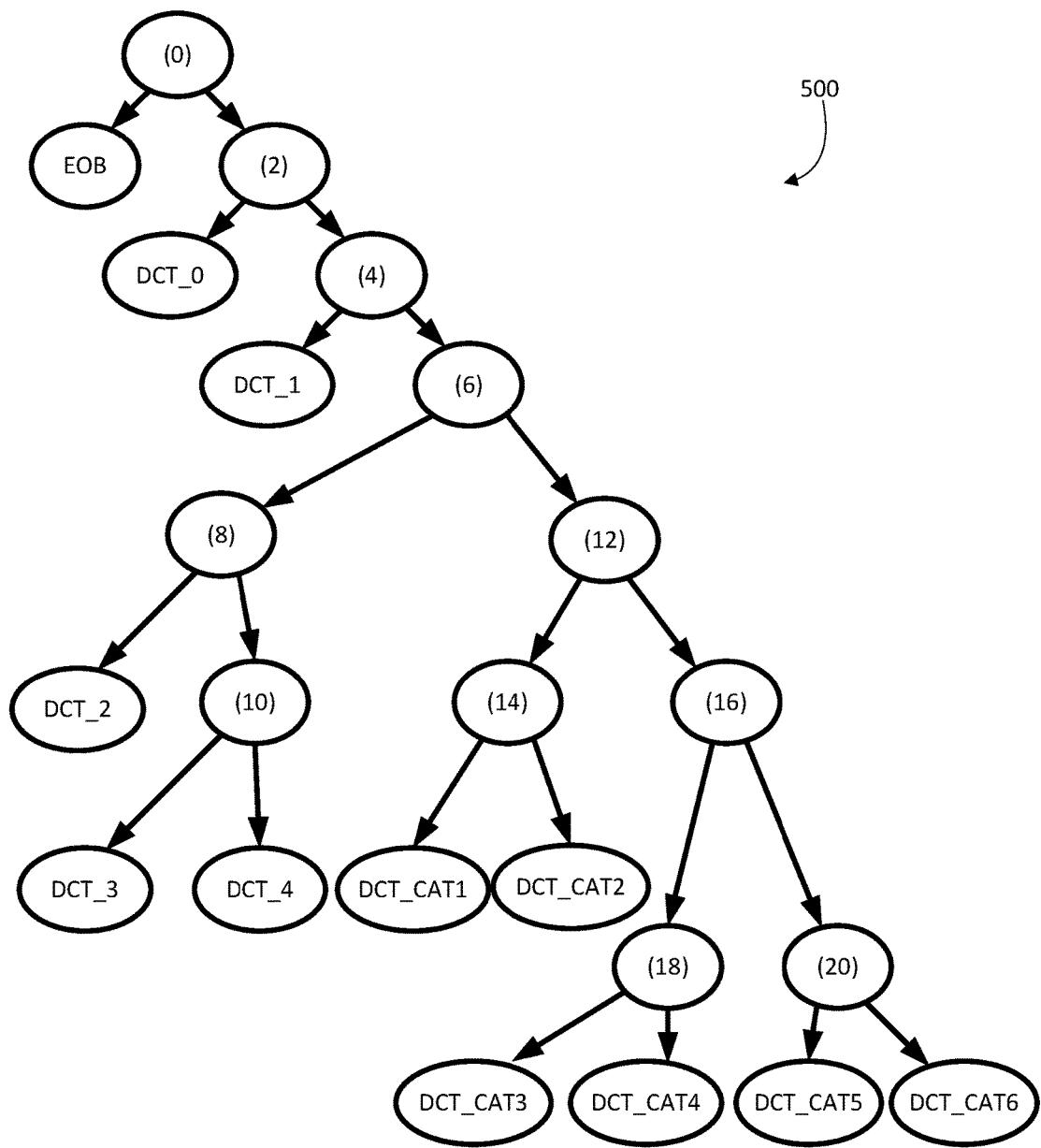
FIG. 5 diagrammatically shows an example coding tree for tokens in VP8 and VP9.

Reference will now be made to FIG. 5, which shows an example coefficient coding tree 500. The tree 500 in this example is the coding tree used for encoding a "token" representative of a quantized transform domain coefficient in VP8 and VP9. A token in VP8 and VP9 is a binary string that indicates the magnitude of a quantized transform domain coefficient. It is defined as follows:

```
typedef enum
{
    DCT_0,          /* value 0 */
    DCT_1,          /* 1 */
    DCT_2,          /* 2 */
    DCT_3,          /* 3 */
    DCT_4,          /* 4 */
    dct_cat1,       /* range 5 - 6   (size 2) */
    dct_cat2,       /* 7 - 10     (4) */
    dct_cat3,       /* 11 - 18    (8) */
    dct_cat4,       /* 19 - 34    (16) */
    dct_cat5,       /* 35 - 66    (32) */
    dct_cat6,       /* 67 - 2048  (1982) */
    dct_eob,        /* end of block */
    num_dct_tokens  /* 12 */
}
dct_token;
```

In the above, dct_cat 1, ..., dct_cat6 each correspond to a finite set of values. To determine the exact value in the set, additional bits are to be encoded and decoded. For example, after dct_cat 1 is decoded, an additional bit is to be decoded to determine whether the value is 5 or 6. Similarly, after dct_cat2 is decoded, two additional bits are to be decoded to determine the value in {7, 8, 9, 10}. For dct_cat3 to dct_cat5, 3, 4, and 5 additional bits are needed, respectively. For dct_cat6, 11 additional bits are needed. Furthermore, for any token other than DCT_0 and dct_eob, a sign bit is to be encoded and decoded.

In order to decode a token using the tree 500, the decoder begins with the root node (0) and follows a path to a leaf node corresponding to the token. Each internal node has an associated binary probability distribution associated with whether the left path or right path is taken. Given that there are 11 internal nodes, this means there are 11 binary distributions.

Context is determined for a token based on plane type, scan position, and nearby coefficients. There are 96 contexts in VP8 and VP9, which means there are 1056 binary probability distributions (11×96) since each context has its own set of probability distributions. These probability distributions may be stored in an array defined as:

Prob coeff_probs [4] [8] [3] [num_dct_tokens−1];

The coeff_probs are typically fixed for a frame/picture or segment. They may be signaled by the encoder to the decoder.

The example coding tree 500 of FIG. 5 may be expressed as follows:

```
const tree_index coeff_tree [2 * (num_dct_tokens − 1)] =
{
    -dct_eob, 2,                  /* eob  = "0"    */
    -DCT_0, 4,                    /* 0    = "10"   */
```

```
    -DCT_1, 6,              /* 1       = "110" */
  8, 12,
      -DCT_2, 10,           /* 2       = "11100" */
        -DCT_3, -DCT_4,     /* 3       = "111010", 4 = "111011" */
  14, 16,
      -dct_cat1, -dct_cat2, /* cat1    = "111100",
                               cat2    = "111101" */
  18, 20,
      -dct_cat3, -dct_cat4, /* cat3    = "1111100",
                               cat4    = "1111101" */
      -dct_cat5, -dct_cat6  /* cat5    = "1111110",
                               Cat6    = "1111111" */
};
```

The internal probability distributions are used by the binary arithmetic coding engine in the encoder and decoder for the arithmetic coding of the bits of a token (i.e. a binarized string). It will be appreciated that the structure of the binarizer is fixed by the tree 500 and only the internal probabilities for a given context are adjusted from time-to-time if needed.

Analysis of the theoretical limits for compression performance of an entropy coding method reveal that, in practical implementations of BAC, the un-normalized compression rate, which is defined as the length of the compressed data sequence in bits, grows linearly with respect to the binary sequence length n. Note that the (normalized) compression rate is defined as the ratio of the un-normalized compression rate and the input sequence length, that is, the average number of bits per input symbol. Accordingly, one of the possible approaches to improving compression efficiency is to improve the quality or efficacy of the binarization, so as to reduce the binary sequence length n. As mentioned above, in existing coding standards, like context-adaptive BAC (CABAC) in H.265/HEVC and VP8/VP9, the binarizer is baked into the context modelling. In particular, the binarizer is fixed for a given context. The binarization is based on a fixed tree or a fixed syntax definition that prescribes how to break down non-binary data (e.g., quantized coefficients) into a binary string. Any binarization that occurs is tied to the context and the transform coefficient data itself, and not to any available probability information.

The present application proposes to signal to the decoder that a modified binarizer is to be used instead of a default binarizer. The encoder may determine to use the modified binarizer in circumstances in which it expects that the modified binarizer will result in a shorter binary sequence than would otherwise be the case with the default binarizer. This change in binarizers is not necessarily a deterministic function of the context, meaning that within the same context (in different blocks or pictures) the encoder/decoder may use different binarizers depending on the selection made by the encoder.

In some example embodiments, the binarizers are pre-designed and the encoder selects the modified binarizer from between two or more pre-defined binarizers, one of which is the default binarizer. In some other example embodiments, the modified binarizer may be constructed on the fly at the encoder. The decoder may either receive details of the newly-constructed binarizer in the bitstream or it may construct the modified binarizer on its own using the same process as the encoder. In some cases, the encoder signals changes to the default binarizer as the mechanism to construct the modified binarizer.

The change in binarizers may be made on the basis of a block, series of blocks, slice, picture, or any other grouping of image/video data, and may be signaled as header information in a header associated with the grouping.

The determination to use a modified binarizer may be based on a number of factors. For example, it may be based upon the encoded history of the data sequence. It may, in some cases, be based upon historical or estimated probabilities associated with a context. It may, in some cases, involve determining or estimating coding distributions of the quantized transform domain coefficients, and constructing a new coding tree that better matches the determined coding distributions. Other mechanisms will be understood by those ordinarily skilled in the art in light of the following description of example embodiments.

Figure 1B:
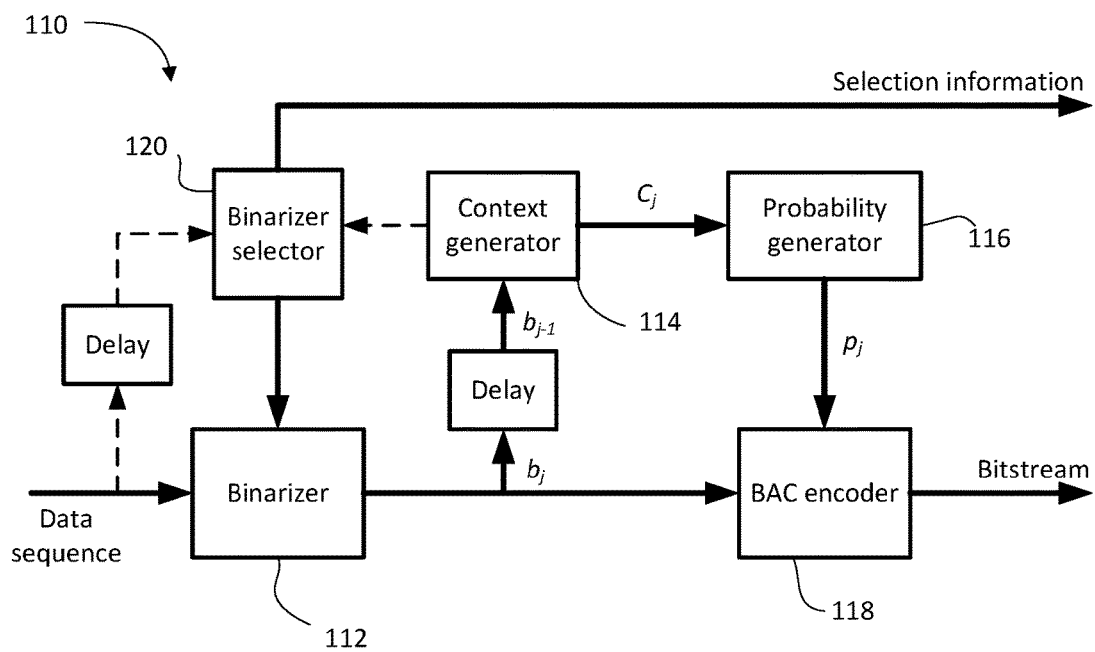
FIG. 1B shows, in simplified block diagram form, an example encoder with a binarizer selector and a binary arithmetic encoder.
Figure 2B:
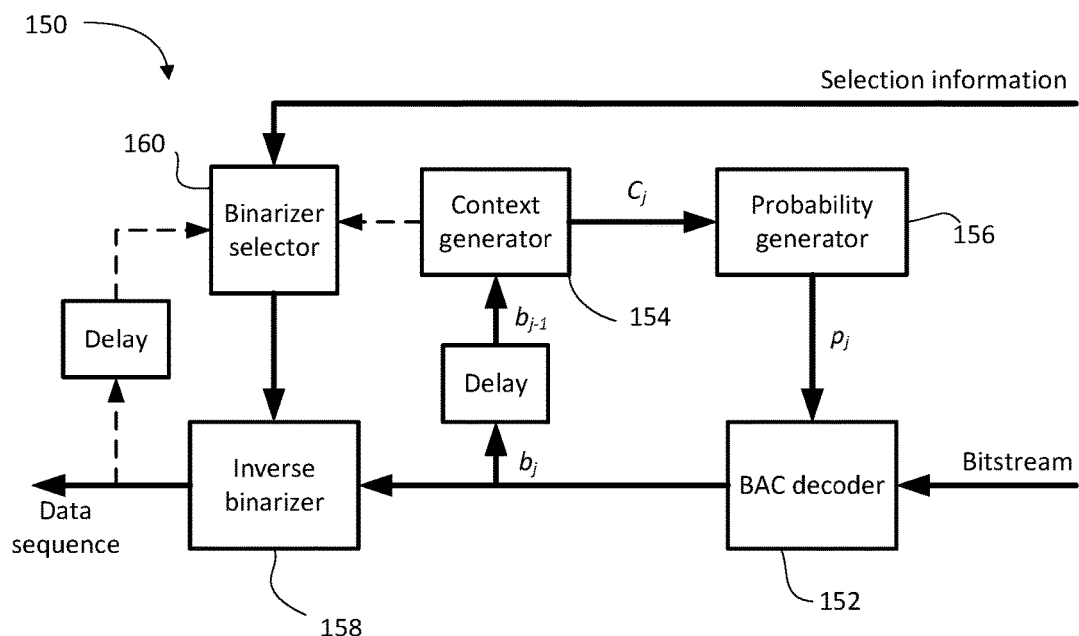
FIG. 2B shows, in simplified block diagram form, an example decoder with a binarizer selector and a binary arithmetic decoder.

Reference will now be made to FIGS. 1B and 2B, which show simplified block diagrams of an encoder 110 and decoder 150, respectively, using adaptive binarizer selection.

The encoder 110 includes a context generator 114, probability generator 116 and BAC encoder 118 for generating an encoded bitstream from a binarized sequence. In the encoder 110, a binarizer selector 120 constructs or selects a binarizer 112 (e.g. possibly from a finite set of predefined candidate binarizers) for binarizing the incoming data sequence. Information regarding the selection (labelled Selection information) may be combined (e.g. multiplexed) with the encoded bitstream (labelled Bitstream) for storage or transmission. In some embodiments, the Selection information is encoded within a header information field.

The construction/selection by the binarizer selector 120 may be based upon the encoded history of the data sequence. It may depend on probability distributions of particular codes or sequences, whether empirically determined or estimated based on previously-coded data. Context information may be received by the binarizer selector 120 in some embodiments.

The decoder 150 includes a BAC decoder 152, a context generator 154 and a probability generator 156. The incoming (demultiplexed) bitstream of encoded data is decoded by the BAC decoder to recreate a binary sequence. The binary sequence is inverse binarized by an inverse binarizer 158 to reconstruct the sequence of symbols. The inverse binarizer 158 is selected/constructed by a binarizer selector 160, based at least in part upon information in Selection information stream. As noted above, the Selection information may be extracted from header fields of the bitstream of encoded data in some cases. The information may, in some embodiments, include information identifying one of a plurality of pre-defined binarizers, information specifying the structure of the inverse binarizer 158, information specifying probability distributions from which the decoder 150 constructs a corresponding inverse binarizer 158, or other such information enabling the decoder 150 to select or construct the inverse binarizer 158.

Figure 3B:
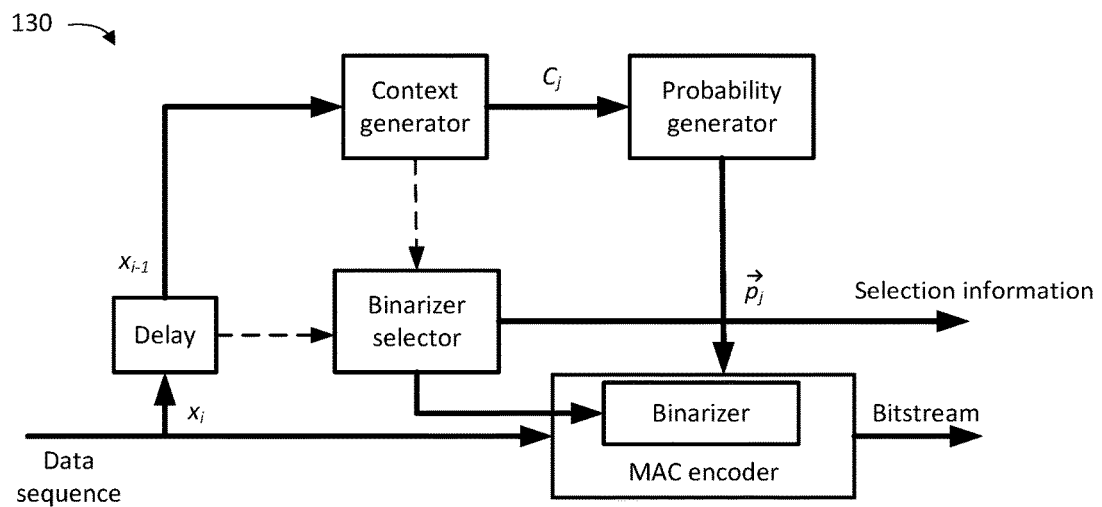
FIG. 3B shows, in simplified block diagram form, an example encoder with a binarizer selector and a multi-level arithmetic encoder.
Figure 4B:
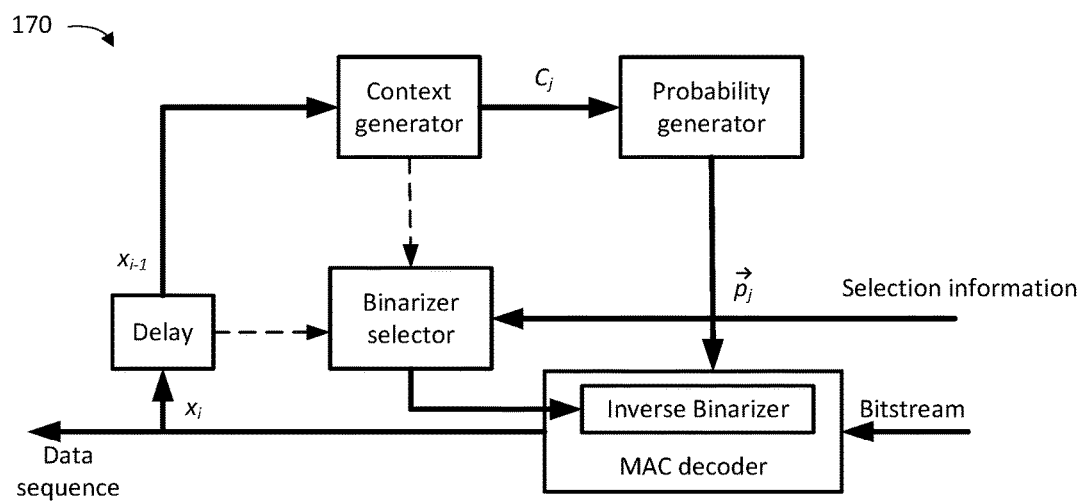
FIG. 4B shows, in simplified block diagram form, an example decoder with a binarizer selector and a multi-level arithmetic decoder.

Reference is now also made to FIGS. 3B and 4B, which show simplified block diagrams of additional examples of an encoder 130 and decoder 170, respectively, using adaptive binarizer selection. These examples also include a binarizer selector and the passing of information regarding the selection/construction of the binarizer from encoder 130 to decoder 170.

In the example embodiments below, the default coding tree shown in FIG. 5 is an example default binarizer. Various embodiments detail how a modified binarizer may be selected or constructed, and how the decoder determines which binarizer to use or build.

The structure of the default coding tree in VP8 and VP9 is based upon an expected distribution of the tokens (i.e. symbols). The actual distribution of tokens for a given set of blocks may deviate from the assumed distribution. Note that a distribution of tokens (sometime termed the "marginal distribution of tokens" herein) is different from the internal node probabilities specified in the coeff_probs array, which are used by BAC in the form of a collection of binary distributions. The marginal distribution of tokens may be specified by a vector of length 12 where each element corresponds to the probability of a distinct token, and the sum of all the token probabilities is equal to 1. Correspondingly, the empirical distribution of tokens in a set of blocks (e.g. slice/picture/frame) is a marginal distribution that may be defined as a vector of length 12 such that each element corresponds to the normalized frequency that a token appears in the set of blocks. Specifically, let n denote the total number of tokens in the picture/frame, and let $f_i$ denote the number of times that token i, $0 \le i \le 12$, appears in the picture/frame. Then the ith element in the vector is equal to $$\frac{f_i}{n},$$

and the vector is:

$$\left(\frac{f_0}{n}, \frac{f_1}{n}, \ldots, \frac{f_{11}}{n}\right)$$

For convenience, in the following we may also use the un-normalized frequency vector $(f_0, f_1, \ldots, f_{11})$ which is sometimes referred to as the un-normalized empirical distribution.

Let $l_i^*$ denote the number of bins used to represent token i in the default coefficient coding tree defined in VP8 and VP9:

$$l_i^* = \begin{cases} 1 & \text{if } i = \text{dct\_eob} \\ 2 & \text{if } i = \text{DCT\_0} \\ 3 & \text{if } i = \text{DCT\_1} \\ 5 & \text{if } i = \text{DCT\_2} \\ 6 & \text{if } i = \text{DCT\_3, DCT\_4} \\ 7 & \text{if } i = \text{dct\_cat1}, \ldots, \text{dct\_cat6} \end{cases}$$

Thus, if the default coefficient tree is used, the total number of bins in the slice/picture/frame to be encoded and decoded is $$\sum_{i=0}^{11} f_i l_i^*$$

Let $l_i$ denote the number of bins used to represent token i by using a selected binarizer that is different from the default coefficient coding tree. Collectively, $(l_0, l_1, \ldots, l_{11})$ is called the length function of the binarizer. It is easy to see that as long as $$\sum_{i=0}^{11} f_i l_i < \sum_{i=0}^{11} f_i l_i^*$$

then the selected binarizer reduces the total number of bins, and the saving is given by $\Sigma_{i=0}^{11} f_i(l_i^* - l_i)$. In order to find a binarizer that satisfies the above inequality, one can perform a search among a set of candidate trees with 12 leaf nodes, that is known both to the encoder and the decoder, e.g. defined in the specifications like Golomb codes, Gallager-Voorhis codes, etc. An alternative method that determines a binarizer by construction is to build a Huffman coding tree with length function $(l_0, l_1, \ldots, l_{11})$ for the given probability distribution $$\left(\frac{f_0}{n}, \frac{f_1}{n}, \ldots, \frac{f_{11}}{n}\right)$$

and use that Huffman coding tree as the binarizer.

Note that it is not necessary to explicitly construct a Huffman coding tree. In fact, a binary coding tree satisfies the following condition might be sufficient:

for any $i \ne j$, $l_i \le l_j$ if $f_i > f_j$

Note that Huffman coding trees satisfy the above condition and thus may be included as candidates. Further note that once a new binarizer is signaled, the probability distributions, i.e., coeff_probs, are to be interpreted by using the new binarizer. That is, coeff_prob[a][b][c][i] denotes the binary distribution at internal node i in the new binarizer, where a, b, c are contexts derived from the plane type, coeff positions, and nearby coefficients.

Selection from Pre-Defined Binarizers

In one embodiment, both the encoder and decoder have two or more predefined binarizers defined in memory, one of which is a default binarizer. For example, in the case of binarization using a coding tree there may be a default coding tree and one or more alternative coding trees. In some examples, the alternative coding trees may be developed based upon a different marginal distribution of symbols (e.g. tokens).

The encoder (specifically, the binarizer selector) may determine for a set of blocks (e.g. a slice, frame, picture, group-of-pictures, etc.) whether to use the default binarizer or one of the alternative binarizers. For example, the encoder may determine or estimate the distribution of tokens for that set of blocks. To actually determine the distribution the encoder may need to use two-pass coding. Alternatively, the encoder may estimate the distribution, perhaps based upon statistics from one or more previous sets of blocks. The binarizer selector at the encoder determines which binarizer to use for coding the blocks and then signals the choice in header information relating to the set of blocks.

In some cases, signaling the binarizer to the decoder may include using a flag or code within the header information. In the case of a single alternative binarizer, the encoder may use a binary flag to indicate whether the default binarizer is being used or not. In the case of multiple alternative binarizers, the encoder may include a code to indicate which of the binarizers is to be used for decoding a set of blocks.

Redistribution of Leaf Nodes

In one embodiment, the structure of the default binarizer stays the same, but the encoder may signal a redistribution of the tokens, i.e. a change to which symbols/tokens are assigned to which leaf nodes. For example, with reference to the VP8 and VP9 coding tree, the encoder may determine that the tokens assigned to particular leaf nodes should be rearranged to improve the efficiency of the binarization for a particular set of blocks. In this case, it may signal the rearrangement to the decoder by specifying the order of the tokens in a header field. The distribution of internal coefficient probabilities (the coeff_prob array) stays the same.

For example, in FIG. 5 the leaf node that stores dct_eob and the leaf node that stores DCT_1 might be swapped, i.e., after swapping, the former with a short path to the root stores DCT_1, and the latter with a longer path stores dct_eob. One of the benefits of using the existing tree is a simple design of entropy coding that is also backward compatible with the existing design in VP8 and VP9. Observe that in these cases, BAC decoding logic does not need to be changed in that:
1. it can use the existing design to determine whether a leaf node is reached, and
2. the probabilities stored in coeff_probs correspond to the same internal nodes in the coefficient coding tree.

The only change to the tree is to the respective tokens stored in the leaf nodes are changed. As such, when use_new_coeff_coding_tree_flag is equal to 1, we may specify the new binarizer by using an array T[num_dct_tokens] where T[i], i=0, . . . , num_dct_tokens−1, specifies the token stored in (i+1)-th leaf node (counted from left to right in FIG. 5). An example array is as follows:

```
T[num_dct_tokens] = {
    DCT_1,          /* 1 */
    DCT_2,          /* 2 */
    DCT_0,          /* value 0 */
    dct_eob,        /* end of block */
    DCT_3,          /* 3 */
    DCT_4,          /* 4 */
    dct_cat1,       /* range 5 - 6      (size 2) */
    dct_cat2,       /* 7 - 10       (4) */
    dct_cat3,       /* 11 - 18      (8) */
    dct_cat4,       /* 19 - 34      (16) */
    dct_cat5,       /* 35 - 66      (32) */
    dct_cat6        /* 67 - 2048    (1982) */
}
```

New Tree Structure

Instead of keeping the default shape of the coding tree, the encoder may determine a new tree structure that better fits the actual or estimated marginal token distribution. The encoder may then signal the new structure to the decoder in header information for a set of blocks. As an example, the new coefficient coding tree might be parsed as an array T[2*(num_dct_tokens−1)], where the following convention is applied:

1. If T[i] is in {0, −1, −2, . . . , −num_dct_tokens}, then T[i] is a leaf node, and −T[i] is the token, i.e., 0 indicates dct_eob, 1 indicates DCT_0, etc.
2. If T[i] is an even integer, then T[i] is an internal node, whose left child is at position T[i] and whose right child is at position T[i]+1. Note that if T[i] is even, then by convention T[i] no less than i+1, i.e., children always appear after their parent.
3. T[0] is the left child of the root, and T[1] is the right child of the root.

Figure 6:
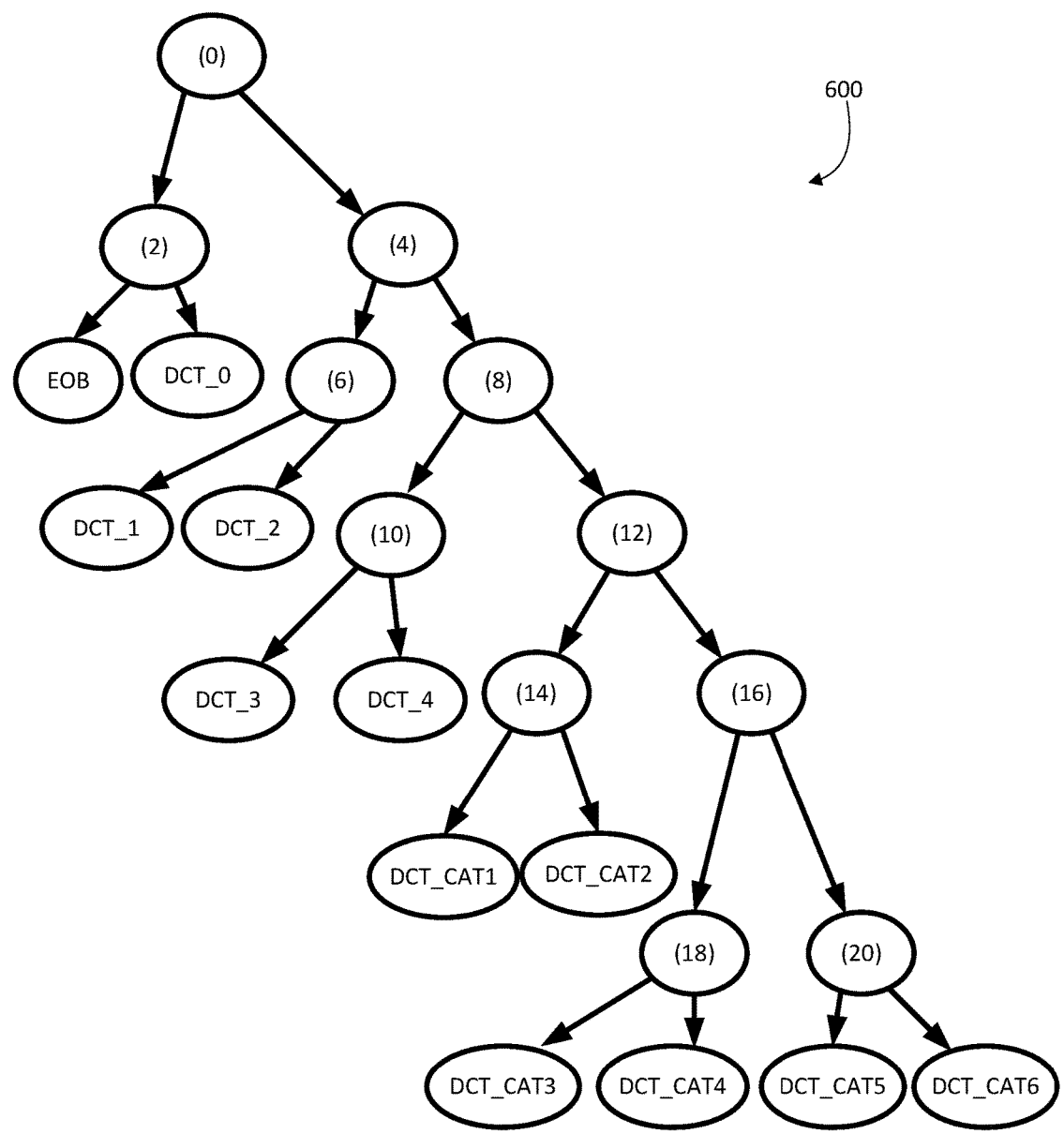
FIG. 6 diagrammatically shows an example of a modified coding tree for tokens.

Reference is made to FIG. 6, which shows one example of an alternative coding tree 600 for VP8 and VP9 tokens. Below is an example of the array T to define and signal the alternative coding tree 600 shown in FIG. 6:

```
T[2*(num_dct_tokens − 1)] =
{
    2, 4,
    -dct_eob, -DCT_0,       /* eob = "00", 0 = "10" */
    6, 8,
    -DCT_1, -DCT_2,         /* 1 = "100", 2 = "101" */
    10, 12,
    -DCT_3, -DCT_4,         /* 3 = "1100", 4 = "1101" */
    14, 16,
    -dct_cat1, -dct_cat2,   /* cat1 = "11100",
                               cat2 = "11101" */
    18, 20,
    -dct_cat3, -dct_cat4,   /* cat3 = "111100",
                               cat4 = "111101" */
    -dct_cat5, -dct_cat6    /* cat5 = "111110",
                               cat6 = "111111" */
};
```

The length function of T can be verified as being (2, 2, 3, 3, 4, 4, 5, 5, 6, 6, 6, 6).

The array T above is structured to facilitate parsing and tree representation. For the purpose of coding and transmission, T may be transformed into another array T' to facilitate entropy coding, where the transformation from T to T is invertible, i.e., T can be fully reconstructed from T'. For example, if T[i] is positive, then T[i]≥2 and is always even. As such, instead of coding T[i] directly, the encoder might encode T'[i]=(T[i]−2)>>1. On the decoder side, after T'[i] is decoded, T[i] can be reconstructed as T[i]=T'[i]*2+2.

The encoder may determine the new tree structure by first determining or estimating the marginal token distribution for the set of blocks, i.e. the normalized frequency with which each token occurs in coding the set of blocks. From this information, the encoder may then determine a coding tree (e.g. a Huffman coding tree) that better fits the marginal distribution. In some implementations, the encoder may determine a coding tree by using the un-normalized empirical distribution that consists of frequency counts of tokens instead of the normalized marginal distribution.

In some embodiments, the encoder may filter the marginal token distribution or equivalently the un-normalized empirical distribution before determining a coding tree that fits the marginal distribution. For example, frequency counts less than a threshold may be replaced by a default value (e.g. 0, 1, or a known positive integer) in the un-normalized empirical distribution. Without losing generality, suppose that the un-normalized empirical distribution is given by $(f_0, f_1, \ldots, f_{11})$, where $f_i$ denotes the frequency count of token i, $0 \le i \le 11$. Then for each i, if $f_i < Th$, where Th denotes a threshold, $\hat{f}_i = 1$; otherwise $\hat{f}_i = f_i$. The resulting vector $(\hat{f}_0, \hat{f}_1, \ldots, \hat{f}_{11})$ is then used to determine a coding tree. After filtering, we see that tokens with frequency counts less than the threshold are treated equally and would have deterministic and limited impact in the process of determining a coding tree. Thus, by using filtering the encoder avoids overfitting in determining a coding tree when there is not enough empirical data. Note that the threshold may be a constant determined a priori or as a function of the total number of tokens, i.e. the sum of all frequency counts.

It will be appreciated that the entire tree may not be signaled in some embodiments in cases where only a partial update of the tree is implemented. This may be used to balance the cost of signaling a new binarizer and the benefit of bin savings. For example, one might want to signal a new tree based on the default tree in 5 where 1. the changes are limited to the subtree corresponding to {dct_eob, DCT_0, DCT_1, DCT_2, DCT_3, DCT_4}; and
2. the subtree rooted at internal node (12) remains unchanged.

Updating Probabilities

As noted above, the binary probability distributions at internal nodes of the

VP8 and VP9 default tree is stored in the coeff_probs array. If a new tree is used, the decoder may need to map the probability distributions associated with the existing default tree (in coeff_probs) to the new tree.

Let $T_1$ and $T_2$ denote two binary trees that represent the same alphabet $A=\{ct_0, \ldots a_{N-1}\}$ with N symbols. Assume that both $T_1$ and $T_2$ are full, and thus they have exactly N−1 internal nodes. Let $(p_{1,0}, \ldots p_{1,N-2})$ denote the binary probability distributions at the N−1 internal nodes of $T_1$: for example, $p_{1,0}$ denote the probability of 1 (or equivalently taking the right branch) at the first internal node (root), $p_{1,1}$ denote the probability of 1 (or equivalently taking the right branch) at the second internal node, and so on. Note that the order of labelling the internal nodes does not matter, in other words, any known order would work with the present solution. Similarly, let $(p_{2,0}, \ldots p_{2,N-2})$ denote the binary probability distributions at the N−1 internal nodes of $T_2$. Suppose that $(p_{1,0}, \ldots p_{1,N-2})$ and $(p_{2,0}, \ldots p_{2,N-2})$ are learned from the same marginal distribution over A. Then the challenge is to map $(p_{1,0}, \ldots p_{1,N-2})$ to $(p_{2,0}, \ldots p_{2,N-2})$ and vice versa.

Let $(q_0, \ldots q_{N-1})$ denote the common marginal distribution over A, where $q_i$, $0 \le i < N$, denotes the probability of $a_i$. Then the challenge is solved by using the following two-stage process:

1. Determine $(q_0, \ldots q_{N-1})$ from $(p_{1,0}, \ldots p_{1,N-2})$ in $T_1$.
2. Determine $(p_{2,0}, \ldots p_{2,N-2})$ from $(q_0, \ldots q_{N-1})$ in $T_2$.

The first stage above can be achieved by using a tree traversal method, e.g., depth-first or breadth-first, to populate the probabilities from top to bottom (top-down). Below is an illustrative example of a depth-first iterative method, where without losing generality it is assumed root node is labelled "0" and corresponds to $p_{1,0}$:

```
dfp2q( )
    dfp2q_iter(root, 1);
end
dfp2q_iter(node, prob)
    if node is a leaf node
        i= node.a; //node.a stores the index of a symbol in //A.
        q_i= prob;
    else
        j= node.label; //node.label stores the label of the
            //internal node.
        dfp2q_iter(node.leftchild, prob*(1−p_{1,j}));
        dfp2q_iter(node.rightchild, prob*p_{1,j});
    end
end
```

As a further example, a breadth-first approach to the first stage may be described as:

```
bfp2q(root)
    root.prob = 1;
    Q = empty queue;
    Q.enqueue(root);
    While not Q.empty do
        node = Q.dequeue( );
        if node is a leaf node
            i= node.a; //node.a stores the index of a symbol //in A.
            q_i= node.prob;
        else
            j= node.label; //node.label stores the label of the
                //internal node.
            node.leftchild.prob = node.prob*(1−p_{1,j});
            Q.enqueue(node.leftchild);
            node.rightchild.prob = node.prob*p_{1,j};
            Q.enqueue(node.rightchild);
        end
    end
end
```

In a similar manner, the second stage can be implemented through traversal of the tree to populate the probability from bottom to top (bottom-up). An example method is illustrated in the following pseudo-code, using a post-order depth-first transversal method:

```
dfq2p( )
    dfq2p_iter(root);
end
dfq2p_iter(node)
    if node is a leaf node
        i= node.a; //node.a stores the index of a symbol in //A.
        node.prob = q_i;
        return;
    else
        dfq2p_iter(node.leftchild);
        dfq2p_iter(node.rightchild);
        node.prob = node.rightchild.prob+node.leftchild.prob;
        j= node.label; //node.label stores the label of the
            //internal node.
        p_{2,j} = node.rightchild.prob/node.prob;
    end
end
```

Accordingly, in some embodiments, the following changes may be made to the process of updating probabilities so as to reduce signaling overhead. Instead of signalling an updating flag for each of the (e.g. 1056) entries in coeff_probs, the present solution may infer a flag (that is not present in the bitstream) as follows. Suppose that a binarizer (or equivalently a coefficient coding tree) is given. Note that each entry in coeff_probs corresponds to an internal node in the coefficient coding tree. If an updating flag associated with an entry in coeff_probs is signalled to be 1 and the entry corresponds to a node a, then all updating flags associated with entries that correspond to nodes in the path from the root to node a are inferred to be 1 and do not need to be signalled in the bitstream. For example, if the updating flag associated with node (8) in FIG. 5 is signalled to be 1, then the updating flags associated with nodes (6), (4), (2), (0) are inferred to be 1 and do not need to be signalled in the bitstream.

In another embodiment, an updating flag may be associated with a level in the coefficient coding tree, where the root node is at level 0, its children are at level 1, and so on. If an updating flag associated with level L>=0 is signalled to be 1, then the updating flags associated with all levels 1<L, i.e., closer to the root level, are inferred to be 1.

It will be appreciated that the above-described tree traversal methods are examples. Other traversal methods, for example, iterative deepening depth-first search, might be used (e.g. to satisfy application requirements like storage complexity, call stack limitation, etc.). It will also be understood that, in some embodiments, fixed-point arithmetic might be used in populating the probabilities in the two-stage mapping process for probabilities described above. Note that it is possible to use a different (higher) precision or even floating-point arithmetic in intermediate steps for better accuracy in the end results.

Decoder-Built Binarizer Based on Probabilities

In the above-described embodiments, the encoder determines/selects a binarizer and then signals the selection to the decoder. In one case, the encoder communicates its selection from among a plurality of predefined binarizers. In another case, the encoder specifies the binarizers. For example, it may send data specifying the structure and assignment of tokens for constructing the modified binarizer. In another example, it may signal the changes to a default structure or assignment of tokens that the decoder may use to create the modified binarizer.

In yet a further embodiment, the encoder does not specify the structure or tokens of a newly-determined coding tree or other binarizer, but instead sends updated probability information and an indication that the decoder should build a new binarizer based on the updated probability information.

Using the VP8 and VP9 coding tree as an example again, the encoder may communicate the internal node probability distribution, e.g. the coeff_probs array, or changes to that array. The encoder further signals whether the decoder should build a new tree or not. The encoder may determine whether a new tree is warranted based upon the degree of difference between the coeff_probs probability distribution and the probabilities for which the default coding tree was originally designed. More than a threshold deviation between one or more of the internal node probabilities may signal that a new coding tree should be used. In another embodiment, the encoder obtains the marginal distribution of tokens and determines from those probability values whether a new tree should be constructed. The encoder may obtain the marginal distribution of tokens from the internal node probabilities using one of the tree traversal techniques described above. More than a threshold change in the marginal distribution of tokens may determine that a new tree should be constructed. The encoder may instruct the decoder to build a new tree using a flag in a header, for example.

The decoder may then use the above-described tree traversal techniques to determine, from the updated coeff_probs probability distributions the corresponding marginal distribution of the tokens. The marginal distribution of the tokens may then be used to determine a suitable coding tree that results in fewer bins used for coding the data.

In yet a further embodiment, the encoder does not indicate whether the decoder should or should not create a new binarizer. Instead, the decoder determines on its own whether a new tree should be constructed and used. The determination may be based on whether there has been more than a threshold change in the probability distributions specified in the updated coeff_probs array. In another embodiment, the decoder calculates the marginal distribution of tokens whenever the coeff_probs array is updated and determines from the marginal distribution of tokens whether a new tree should be constructed, for example based on whether the marginal distribution of tokens has deviated more than a threshold amount from the probabilities upon which the default tree (or current tree if using a modified coding tree) is based.

Context-Adaptive Binarizer Selection

In some of the above-described embodiments, a single binarizer is selected for coding tokens for a set of blocks (e.g. frame/picture). In another embodiment, multiple available binarizers may be used within a set of blocks, e.g. picture/frame, and for a current non-binary symbol, one binarizer is selected from among the multiple available binarizers according to the contextual information, e.g. a context derived for the symbol.

This solution is illustrated using elements of VP8 and VP9 as an example, in which:

1. There are 96 contexts defined for 12 tokens.
2. Before encoding a token, a context is derived from the known information: plane type, coeff positions, and nearby coefficients.
3. Before decoding a token, a context is derived from the known information: plane type, coeff positions, and nearby coefficients
4. For each context, we can estimate an empirical distribution over the tokens in a picture/frame.

The context is known to both the encoder and the decoder in VP8 and VP9 before encoding and decoding a token, respectively.

In the present embodiment, the context is used as the basis to select a binarizer from a finite set of candidate binarizers. In one example, in the picture/frame header, a table that maps the 96 contexts to binarizers may be signaled in the bitstream; and when such a table is not present in the bitstream, a default table may be used. Let $\mathcal{B} = \{T_0, T_1, \ldots, T_N\}$, $N>1$, denote a finite set of binarizers. The table might be defined as an array M [4] [8] [3] where each entry is an index in $\mathcal{B}$, i.e., for the context given by (a, b, c), where $0 \leq a < 4$, $0 \leq b < 8$, and $0 \leq c < 3$, $T_{M[a][b][c]}$ in $\mathcal{B}$ is the binarizer selected.

Once the table M is parsed, the decoder can then select the binarizer for each token to be decoded according to the derived context. Furthermore, we note that the probability distributions in coeff_probs[a][b][c][ ] should now be interpreted according to the binarizer $T_{M[a][b][c]}$ selected for the context given by (a, b, c).

In summary, an example decoder may use the following process to decode a token v:

D1. Determine the context (a, b, c) for the token as defined in VP#.
D2. Select the binarizer T as $T_{M[a][b][c]}$.
D3. Decode v by using coeff_probs[a][b][c] and T.

Correspondingly, an example encoder may use the following process to encode a token v:

E1. Determine the context (a, b, c) for the token as defined in VP#.
E2. Select the binarizer T as $T_{M[a][b][c]}$.
E3. Binarize v by using T into a binary string $T(v) = b_0 b_1 \ldots b_{l(v)}$, where l(v) is the number of bins, and T(v) is the path from the root to the leaf corresponding to v in T.
E4. Encode T(v) by using coeff_probs[a][b][c].

Figure 7A:
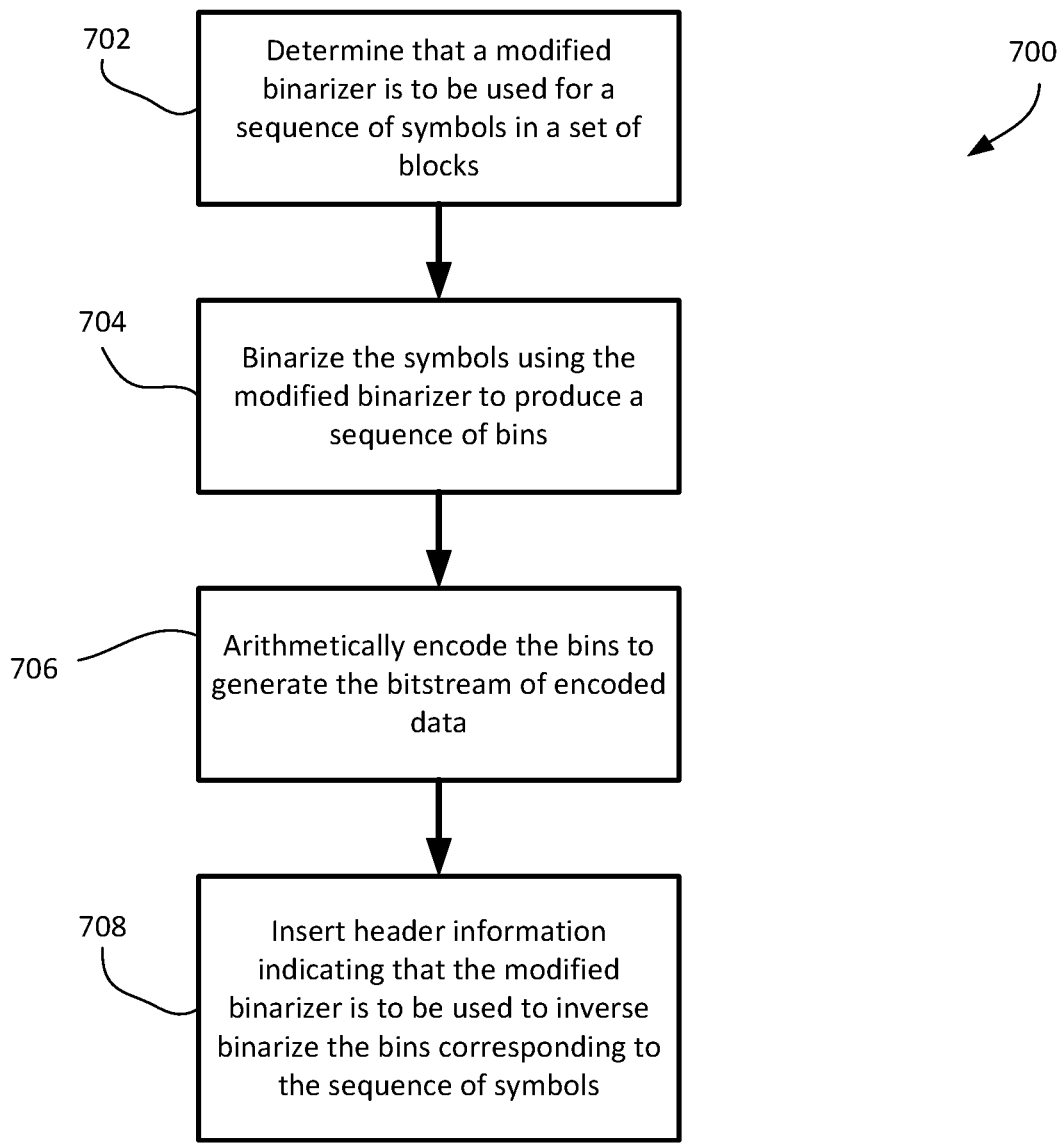
FIG. 7A shows, in flowchart form, an example process for encoding an image using binarizer selection.

Reference is now made to FIG. 7A, which shows a flowchart for an example encoding process 700 for encoding an image in an image or video encoder. The process 700 is implemented using a coding architecture that includes an arithmetic encoder to convert bins into a bitstream of encoded data using arithmetic coding (whether binary arithmetic coding or multi-level arithmetic coding). The process 700 presumes that the image has been subject to an image or video coding process to create a sequence of symbols. Example symbols may include the magnitude of quantized transform domain coefficients, or "tokens" representative of quantized transform domain coefficients.

The coding architecture also includes a default binarizer. One example of a default binarizer is the default coding tree for tokens in VP8/VP9.

The process 700 includes an operation 702 of determining that a modified binarizer is to be used instead of the default binarizer prescribed for a sequence of symbols. The determination to use the modified binarizer may be based, for example, on an assessment (measured or estimated) of normalized frequency of occurrence of the symbols in the image and an assessment of the difference between those frequencies and the marginal probabilities for those symbols upon which the default binarizer is based.

In some embodiments, operation 702 may include constructing the modified binarizer based on the measured or estimated normalized frequency of occurrence of the symbols. In some embodiments, operation 702 may include selecting the modified binarizer from among a plurality of pre-constructed/pre-established binarizers.

In operation 704 the sequence of symbols is binarized using the modified binarizer to generate a sequence of bins. The sequence of bins is then arithmetically encoded using the arithmetic encoder in operation 706 to produce the bitstream of encoded data.

In order to ensure that the decoder may properly reconstruct the image, the process 700 further in includes an operation 708 of inserting header information into the bitstream. The header information indicates that the modified binarizer is to be used for inverse binarizing the sequence of bins corresponding to the sequence of symbols. It will be appreciated that the header information may be placed in a header corresponding to a series of blocks, such as a slice, frame, picture, group-of-pictures, or other collection of blocks. The header information indicates that, for at least a particular sequence of symbols in that series of blocks, e.g. tokens, that the decoder is to use a modified binarizer instead of the default binarizer.

In the simplest case, the header information includes a flag indicating that a modified binarizer is to be used. The decoder may then use side information (such as probability information) to either select or construct a binarizer. In some other cases, the header information specifies the allocation of symbols to leaf nodes of a default structure. In yet other cases, the header information specifies a new or modified structure for a coding tree. In further cases, other details of the binarizer construction may be specified in the header information.

Figure 7B:
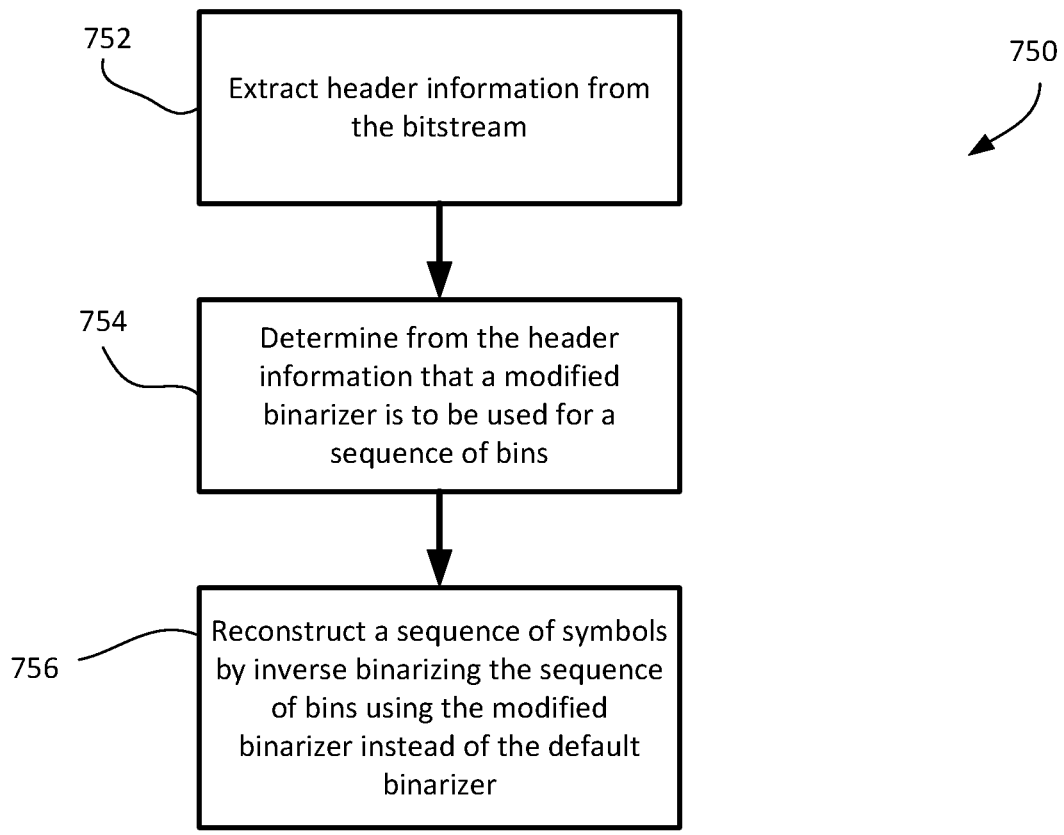
FIG. 7B shows, in flowchart form, an example process for decoding a bitstream to reconstruct an image using binarizer selection.

Reference is now made to FIG. 7B, which shows a flowchart of an example decoding process 750. The process 750 is implemented by an example decoder for images or video that includes an arithmetic decoder and includes a default binarizer (for inverse binarizing bins to reconstruct symbols). The example process 750 includes extracting the header information from the bitstream, as indicated by operation 752.

The header information indicates whether to use a modified binarizer or the default binarizer. Accordingly, in operation 754, the decoder determines, from the header information, that a modified binarizer is to be used instead of the default binarizer. Note that in some cases this may be an explicit instruction in the header information, such as a flag specifying that a modified binarizer is to be used, or an index specifying a particular modified binarizer from among a plurality of pre-determined binarizer options. In some other cases, the header information specifies the modified binarizer. For example, it may specify changes to the default binarizer, such as a reallocation of symbols among leaf nodes of a coding tree, or it may specify changes to the structure of the coding tree. In yet other examples, the header information may specify all or part of the structure of the binarizer, such as the structure of a Huffman tree and the allocation of symbols among its leaf nodes. Any in yet other embodiments, the header information may provide data, such as probability information (e.g. the coeff_probs array) from which the decoder may determine that a modified binarizer is to be used instead of the default binarizer.

In operation 756, the modified binarizer is used to inverse binarize the sequence of bins (which has been arithmetically decoded from the bitstream) to reconstruct the sequence of symbols.

Adaptive Binarizer Selection

In some of the above-described embodiments, the binarizer selection is signaled to the decoder in the bitstream. This may occur through sending a selection index or flag specifying selection of a pre-designed binarizer, through sending information specifying the construction of a modified binarizer, or through sending statistical data regarding the image (e.g. probability distributions) from which the decoder may build the modified binarizer. In some of those embodiments, to achieve optimal performance in minimizing the number of bins to be processed, two-pass encoding is used: the first pass is to collect the statistics necessary to build an optimal binarizer, and the second pass is to use the new binarizer in the encoding process. In embodiments in which the first pass is skipped or replaced with some heuristic method, the resulting binarizer might be suboptimal.

An alternative approach that relies upon one-pass encoding is "adaptive binarizer selection", where binarizers are learned and updated on the fly during the encoding and decoding process. In this solution, a binarizer is selected (e.g. built/modified) based upon the evolving probability distributions of the data as it is being coded. In some cases, this may be referred to as binarizer "tuning".

Figure 8:
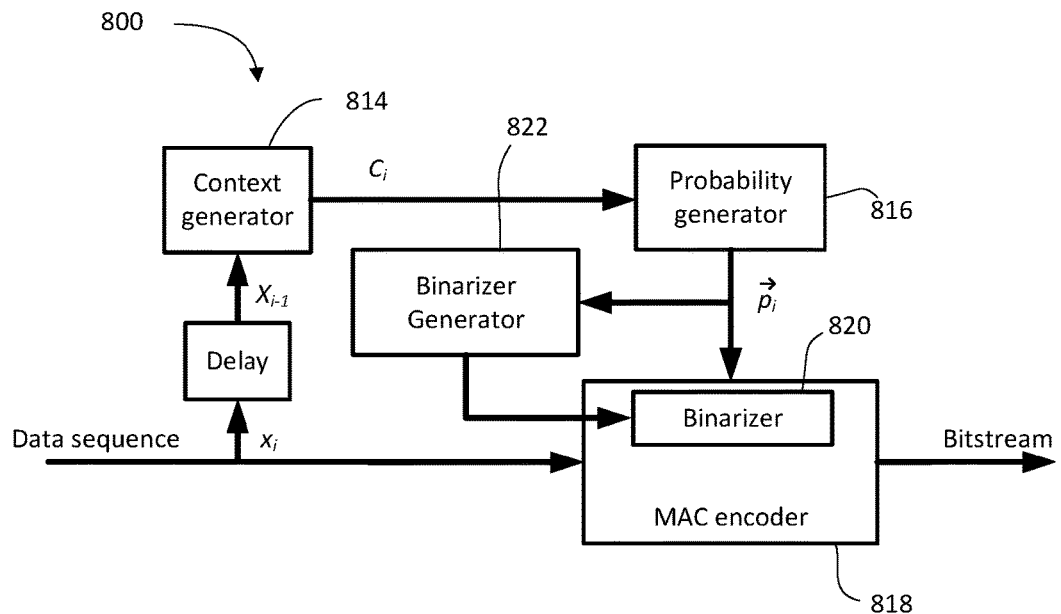
FIG. 8 shows, in block diagram form, an example of an encoder using adaptive binarizer selection.

Reference is now made to FIG. 8, which shows one simplified example, in block diagram form, of an encoder 800 with adaptive binarizer selection. It will be noted that the context model in this example embodiment is defined before binarization at the symbol level, whereas in some of the above-described examples the context modelling may occur either before or after binarization. In this example, both the binarizers and the probability distributions may change from symbol-to-symbol, and the former is at least partly dependent on the latter.

The encoder 800 encodes a data sequence of symbols from an alphabet with a cardinality greater than 2. The encoder 800 includes a context generator 814 that determines a context for the input symbol, and a probability generator 816 that associates a probability vector $\vec{p}_i$ with the determined context. The probability vector $\vec{p}_i$ is used as the coding distribution by a MAC encoder 818. The encoder 800 includes a binarizer generator 822 that generates a binarizer 820 for use by the MAC encoder 818, where the generation of the binarizer 820 is at least partly based upon the probability vector $\vec{p}_i$.

In some embodiments, the binarizer generator 822 may construct a new binarizer based on the probability vector $\vec{p}_i$. In some embodiments, the binarizer generator 822 may select the new binarizer from among a finite set of candidate binarizers. The new binarizer 820 is then used in the binarization of the symbol during MAC encoding by the MAC encoder 818.

The probability distribution, i.e. probability vector $\vec{p}_i$, is then updated based on the encoded symbol.

Figure 9:
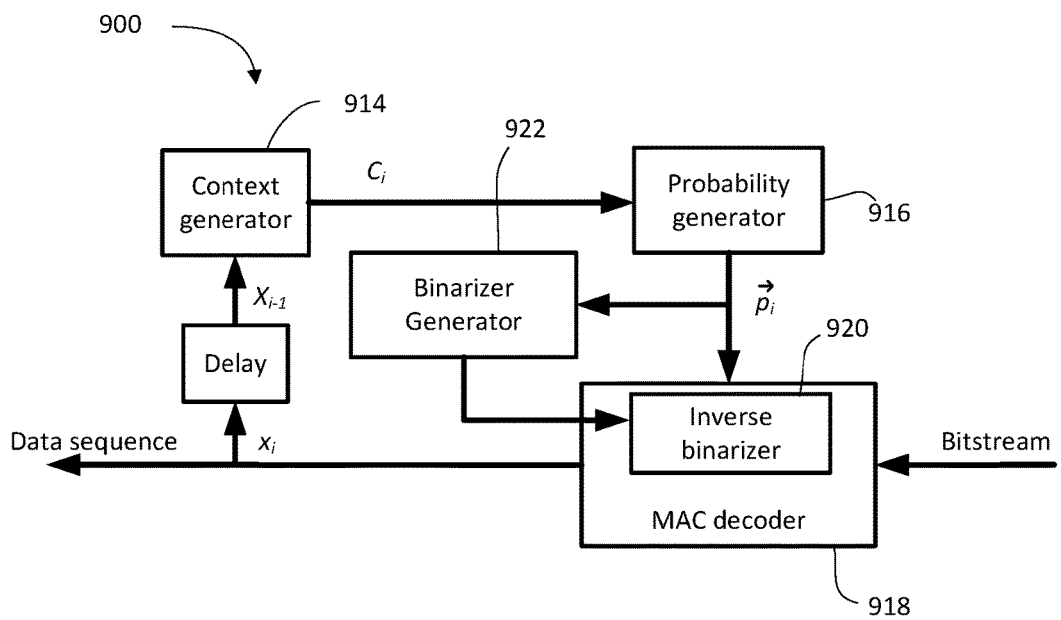
FIG. 9 shows, in block diagram form, an example of a decoder using adaptive binarizer selection.

FIG. 9 shows an example decoder 900 that uses adaptive binarizer selection. The decoder 900 includes a context generator 914, probability generator 916 and MAC decoder 918. An incoming bitstream of encoded data is arithmetically decoded and inverse binarized by the MAC decoder 918 to reconstruct a sequence of symbols. A binarizer generator 922 determines the binarizer 920 to be used by the MAC decoder 918 for inverse binarization with respect to an encoded symbol in the bitstream. The binarizer generator 922 bases determination of the binarizer 920 on the probability distribution (probability vector $\vec{p}_i$) output by the probability generator 916. Once the symbol is decoded by the MAC decoder 918, the probability distribution is updated.

It will be appreciated that, in some examples, a symbol may be a quantized transform coefficient, a pixel value, an intra prediction mode, a motion vector or a motion vector difference, or any non-binary syntax element.

In some embodiments, determining a binarizer may further depend upon whether a certain set of conditions are met, for example, at least T>1 number of symbols have been decoded by using the same context since the last time a binarizer was determined.

In some embodiments, the probability distribution associated with the context might not be updated every time after a symbol is encoded/decoded. In these cases, the distribution might be determined once a context is selected, for example, from side information available to both the encoder and the decoder. Side information may include the probability distribution associated with the context coded and transmitted separately, or a training sequence that is available to both encoder and decoder from which probability distributions may be estimated, for example.

In the case where binarization is fully integrated into arithmetic coding as an integral part, the described adaptive binarizer selection solution can be regarded as an improved design of multi-symbol arithmetic coding where the ordering of symbols may be changed to facilitate the search for a symbol in a given alphabet A. Note that the search may be linear as in the so-called "CACM implementation" of arithmetic multi-symbol coding described in Whitten et al. "Arithmetic coding for data compression", 1987, *Commun. ACM* 30, 520-540, where CACM is short for "*Commun. ACM*". The CACM implementation search can be defined as:

---

Find i in A such that
cum_freq[i] <= (value-low)/(high-low) < cum_freq[i-1]

---

In the above, cum_freq is an array storing the cumulative frequencies, value is the received bitstring, and [low, high] defines the range of the current interval used for coding. Note that since i is known at the encoder, the search procedure is not present at the encoder. For this reason, the CACM decoder is typically more complex than the CACM encoder. In a normal CACM implementation the ordering of the symbols in the alphabet A is fixed.

An efficient search strategy might use a binary tree to reduce the search complexity, where the tree might change as the input probability distribution changes. In such an example, the binary tree replaces cum_freq in a normal CACM implementation. Note that linear search can be regarded as a special case of binary search where each internal node has at least one leaf node as its child. Further note that in some embodiments, the tree shape might be fixed, but the mapping between the symbols in the given alphabet and the leaf nodes might change according to the probability distributions. For example, the present solution might order the symbols according to the probabilities to speed up the linear search.

Accordingly, the encoder and decoder using adaptive binarizer selection may determine a binarizer by determining/constructing a binary tree from the determined probability distribution. In the binary tree, each internal node may store a binary distribution, e.g., the probability of taking the left branch, to facilitate BAC encoding/decoding. The binary distributions stored at the internal nodes may be derived from the probability distribution associated with the context.

Though the description herein is focused on BAC, the proposed solutions are equally applicable to other entropy coding methods like binary V2V (Variable length-to-Variable length) coding, binary V2F (Variable length-to-Fixed length) coding, and binary F2V (Fixed length-to-Variable length) coding. Here a binary V2V code maps variable-length binary input strings to variable-length binary output strings, a binary V2F code maps variable-length binary input strings to fixed-length binary output strings, and a binary F2V code maps fixed-length binary input strings to variable-length binary output strings. Furthermore, the proposed solutions may be extended to ternary (base-3), quaternary (base-4), or general fixed-radix base-D numeral systems (D≥2), where ternary, quaternary, and general D-ary trees, respectively, may be used to in place of binary trees.

Figure 10:
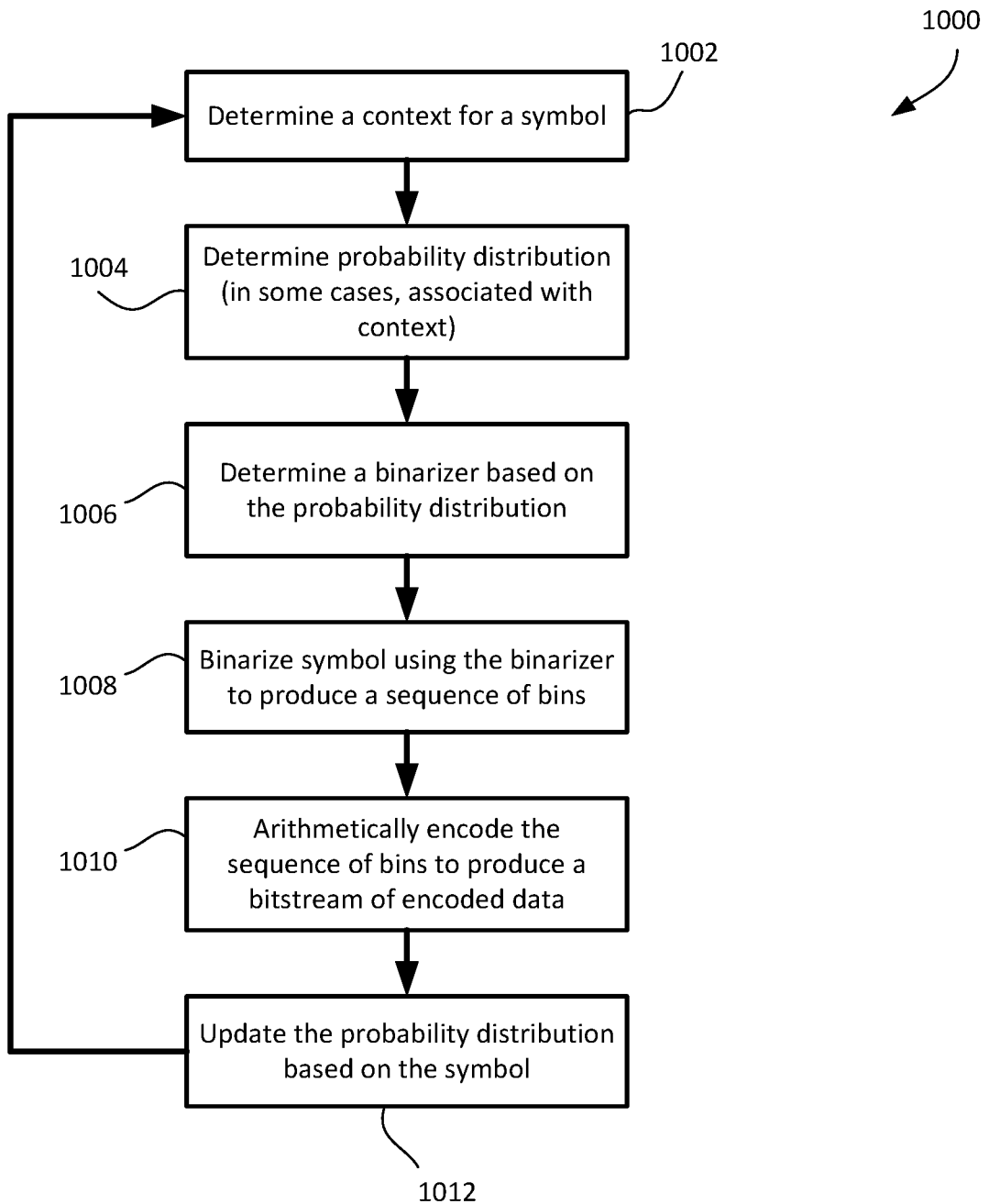
FIG. 10 shows, in flowchart form, an example process for encoding an image using adaptive binarizer selection.

Reference is now made to FIG. 10, which shows, in flowchart form, one example process 1000 for encoding an image in a video or image encoder. The image is processed in accordance with a coding format to produce a sequence of symbols (e.g. quantized transform domain coefficients, in some embodiments). That sequence of symbols is encoded by the encoder using multi-symbol arithmetic coding, and using adaptive binarizer selection.

The process 1000 includes determining a context for a symbol in the sequence of symbols, as indicated by operation 1002. The context is determined based on a context model. In operation 1004, the encoder determines a probability distribution by using the context for the alphabet of symbols. The probability distribution may be stored vector or sequence of probabilities associated with frequency of occurrence of the symbols in the alphabet. In some cases, the probability distribution is specific to the determined context (or a grouping of contexts, in some cases).

In operation 1006, the encoder determines a binarizer based on the probability distribution. This may include selecting from among a set of candidate binarizers based on the probability distribution in some cases. In other cases, it may include building a binarizer based on the probability distribution. In some cases, building the binarizer may include modifying a default or existing binarizer to better match the probability distribution determined in operation 1004.

The binarizer selected or constructed in operation 1006 is then used to binarizer the symbol in operation 1008, producing a sequence of bins, which are then arithmetically encoded in operation 1010 to produce the bitstream of encoded data.

In operation 1012, in this example, the encoded symbol is used to update the probability distribution before the encoder returns to operation 1002 to determine the context for the next symbol.

Figure 11:
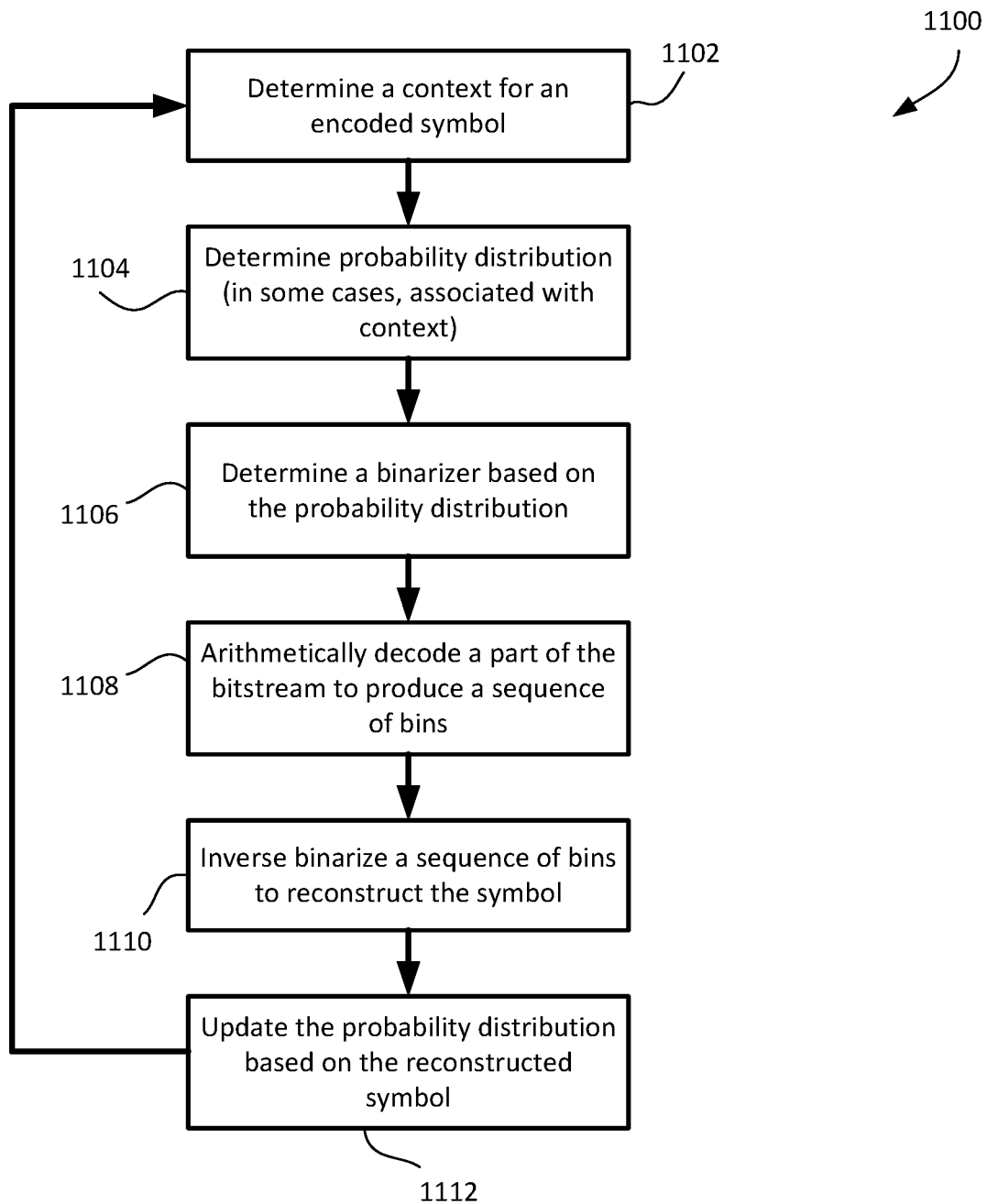
FIG. 11 shows, in flowchart form, an example process for decoding a bitstream to reconstruct an image using adaptive binarizer selection.

FIG. 11 shows, in flowchart form, an example process 1100 for decoding a bitstream of encoded data to reconstruct an image in a video or image decoder. The process 1100 includes determining a context for an encoded symbol in the bitstream, as indicted by operation 1102. The decoder then determines a probability distribution (in many cases, associated with the determined context) in operation 1104. The probability distribution may be stored in memory as a vector or array of probabilities each associated with a respective symbol in the alphabet of symbols, such that operation 1104 involves retrieving the stored distribution from memory.

In operation 1106, the decoder uses the probability distribution to determine a binarizer for inverse binarizing the binary data to reconstruct the symbol. Once the binarizer has been determined (or selected), then in operation 1108 the decoder arithmetically decodes a portion of the bitstream to reconstruct a sequence of bins corresponding to the binarized symbol, and then inverse binarizes that sequence of bins using the determined binarizer to reconstruct the symbol in operation 1110. In operation 1112 the probability distribution is updated based on the reconstructed symbol.

Tree Construction Example

As described above, various tree-traversal methods may be used (e.g. depth first or breadth-first) to map a marginal distribution to internal node probabilities or vice versa. In the example below, a binarizer is constructed for alphabet A from a given marginal distribution $(q_0, \ldots q_{N-1})$ over A and the probability distributions $(p_0, \ldots p_{N-2})$ at internal nodes are obtained. Without losing generality, assume that $(q_0, \ldots q_{N-1})$ is sorted, i.e. $q_0 \geq q_1 \geq \ldots \geq q_{N-1}$. Note that if $(q_0, \ldots q_{N-1})$ is not initially sorted, a sorting step may be added to make sure that the input probability distribution to the following process is sorted. To construct a binarizer T for alphabet A with marginal distribution $(q_0, \ldots q_N)$, the following example process may be used:

1. Initialize a counter k to 0.
2. Create N nodes with labels N−1, . . . , 2N−2 such that node (N−1+i) has probability $q_i$, $0 \leq i < N$, i.e. the node contains the symbol in A associated with that probability.
3. Create an internal node with label (N−2−k) whose children are the two existing nodes satisfying the following conditions:
   I. The two nodes are root nodes of their respective sub-trees. In other words, the two nodes are not children of any other existing nodes.
   II. The two nodes have the least probabilities among all nodes satisfying condition I above. Denote these two probabilities by $q_0^{(k)}$ and $q_1^{(k)}$, respectively.
4. Then the node (N−2−k) has probability $q_{N-2-k} = q_0^{(k)} + q_1^{(k)}$, and the coding probability $p_{N-2-k}$ at node (N−2−k) is given by $$p_{N-2-k} = \frac{q_1^{(k)}}{q_0^{(k)} + q_1^{(k)}}.$$

Note that it is possible to make sure that $q_0^{(k)} \geq q_1^{(k)}$ and thus $p_{N-2-k}$ is always below 0.5.

5. Increase k by 1.
6. Repeat Steps 3-5 until k is equal to N−2.

The above process generates a full binary tree with N−1 internal nodes that defines a binarizer T for alphabet A. The binary probabilities distributions at the internal nodes are given by $(p_0, \ldots p_{N-2})$, where $p_j$ is the probability of 1 (taking the right branch) at internal node j, $0 \leq j < N-1$.

It may be observed that the process above is the same as constructing a Huffman coding tree for the given distribution $(q_0, \ldots q_{N-1})$, with the main difference in Step 4 where the probability $p_{N-2-k}$, $0 \leq k < N-1$, is calculated. In practical applications where BAC accepts a finite precision representation of $p_{N-2-k}$, $p_{N-2-k}$ might be quantized either during the tree construction process or after the complete tree T is constructed. Note that since the example process may guarantee that $p_{N-2-k} \leq 0.5$, one bit (the most significant bit) may be saved in storing $p_{N-2-k}$: if BAC uses M bits internally to represent probabilities in (0,1), $p_{N-2-k}$ may be stored by using M−1 bits, where M is a positive integer.

It will also be appreciated that, since $(q_0, \ldots q_{N-1})$ is primarily used in context modelling and $(p_0, \ldots p_{N-2})$ is primarily used in coding, the proposed solution may use the following implementation in practice:

1. Elements in $(q_0, \ldots q_{N-1})$ are stored and maintained as frequency counts, i.e., un-normalized to save computational and storage complexity.
2. Elements in $(p_0, \ldots p_{N-2})$ are stored and maintained with the arithmetic precision required as input to BAC. For 8-bit BAC, $p_j$ might be stored as an 8-bit unsigned integer (or 7-bit if it is known that $p_j$ is the probability of the less probable symbol).
3. The computation of $$\frac{q_1^{(k)}}{q_0^{(k)} + q_1^{(k)}}$$

above might be implemented in integer arithmetic.

Furthermore, the division might be approximated by using shifting operations.

Adaptive Binarization

Let $x^m = x_1 x_2 \ldots x_m$ denote a sequence from alphabet A to be compressed. For this example, presume a probabilistic model that assumes $x^m$ is emitted from a memoryless source with unknown probability distribution over A. Starting with an initial marginal distribution $(q_{1,0}, \ldots q_{1,N-1})$, the model updates the distribution after each symbol is encoded or decoded as follows 1. Initialize i=1.
2. Encode/Decode $x_i$ by using arithmetic coding with distribution $(q_{i,0}, \ldots q_{i,N-1})$.
3. Update $(q_{i,0}, \ldots q_{i,N-1})$ to $(q_{i+1,0}, \ldots q_{i+1,N-1})$ by including $x_i$.
4. Increase i by 1.
5. Repeat Steps 2-3 above until i is equal to N.

In Step 3 above, updating the probability distribution might be achieved by using probability estimators including, for example, the Laplace estimator, the Krichevsky-Trofimov (KT) estimator, a finite state model, or their variants.

In Step 2 above, it may be noted that the probability distribution $(q_{i,0}, \ldots q_{i,N-1})$ might change after each $x_i$ is encoded or decoded, i.e., $(q_{i,0}, \ldots q_{i,N-1})$ and $(q_{i+1,0}, \ldots q_{i+1,N-1})$ might not be the same. If such a change happens, a new binarizer might be needed for $x_{i+1}$. Let $T_i$ denote the binarizer for $x_i$. To adapt the binarizer used for each $x_i$, $T_i$ might be generated for $x_i$ according to the coding distribution $(q_{i,0}, \ldots q_{i,N-1})$, for example, by using the tree construction method described above. Consequently, Step 2 above on the encoder-side may be implemented as:

3.Ea. Generate a binarizer $T_i$ for alphabet A with distribution $(q_{i,0}, \ldots q_{i,N-1})$, and obtain binary distributions $(p_{i,0}, \ldots p_{i,N-2})$ at the internal nodes of $T_i$.

3.Eb. Convert $x_i$ into a binary string by using the binarizer $T_i$.

3.Ec. Encode the binary string by using BAC with $(p_{i,0}, \ldots p_{i,N-2})$.

On the decoder side, Step 2 above might be implemented as follows:

3.Da. Generate a binarizer $T_i$ for alphabet A with distribution $(q_{i,0}, \ldots q_{i,N-1})$, and obtain binary distributions $(p_{i,0}, \ldots p_{i,N-2})$ at the internal nodes of $T_i$.

3.Db. Decode a binary string by using BAC with $(p_{i,0}, \ldots p_{i,N-2})$ such that the binary string is a path leading from the root to a leaf node in $T_i$.

3.Dc. Decode $x_i$ as the symbol in A associated with the leaf node in $T_i$ identified above.

In Step 2. Ea/2.Da above, generating $T_i$ might be implemented by updating $T_{i-1}$ if the differences between $(q_{i,0}, \ldots q_{i,N-1})$ and $(q_{i-1,0}, \ldots q_{i-1,N-1})$ are sparse. For example, if $T_{i-1}$ is a Huffman tree for $(q_{i-1,0}, \ldots q_{i-1,N-1})$, then one can construct $T_i$ as a Huffman tree for $(q_{i,0}, \ldots q_{i,N-1})$. Note that in order to check if $T_i$ does not need to be updated, one can check to verify if $T_{i-1}$ satisfies the sibling property for $(q_{i,0}, \ldots q_{i,N-1})$. If the answer is yes, then $T_i = T_{i-1}$; otherwise, an update may be carried out.

Finally, to reduce computational complexity involved in generating $T_i$ some embodiments may only update binarizers once every $L>1$ symbols are encoded/decoded, or if $(q_{i,0}, \ldots q_{i,N-1})$ is sufficiently different from $(q_{*,0}, \ldots q_{*,N-1})$ which denotes the marginal distribution over A used to generate $T_{i-1}$, i.e. the previous binarizer. The difference between $(q_{i,0}, \ldots q_{i,N-1})$ and $(q_{*,0}, \ldots q_{i,N-1})$ may be measured, for example, by using the $L^p$-norm (examples of p include 1, 2, and $\infty$), the KL divergence, the Hamming distance, or the number of positions at which the sibling property is violated by $T_{i-1}$ for $(q_{i,0}, \ldots q_{i,N-1})$.

Simplifications

In some embodiments, for a given alphabet A, adaptive binarization may be applied to a coarser set S to balance the computational cost of adaptive binarization and the benefit of bin savings, and given S, the symbols of A are, if necessary, binarized by using a default static binarization scheme. In the above, the coarser set S may have the following properties:

1. the cardinality of S is less than that of A, and
2. each symbol in S corresponds to one or more symbols in A. In other words, a symbol in S might be considered as a result of merging one or more symbols in A.

As an example, suppose that $A=\{0, \pm 1, \pm 2, \ldots, \pm 32767\}$. A coarse set S might be defined as $S=\{s_0, s_1, s_2, s_3\}$, where $s_0$ corresponds to 0 in A, $s_1$ corresponds to $\pm 1$ in A, $s_2$ corresponds to $\pm 2$ in A, and $s_3$ corresponds to all the other symbols in A.

In some other cases, for a given alphabet $A=\{0,1, \ldots, N-1\}$ the encoding/decoding process may implement adaptive binarization by keeping the shape of the tree that defines the binarizer, and changing only the mapping between the leaf nodes and the symbols in alphabet A according to the evolving distribution $(q_{i,0}, \ldots q_{i,N-1})$ Let $l_k$ denote the number of bins needed to reach leaf node k from the root node in the tree. Collectively, $(l_0, l_1, \ldots, l_{N-1})$ is called the length function of the tree. Let $\pi$ denote a permutation of $\{0,1, \ldots, N-1\}$ such that $\pi(k)$ denotes the index of the leaf node that stores symbol k in A. Let $\pi_i$ denote the permutation selected at time instant i. Then given $\pi_{i-1}$, $(q_{i,0}, \ldots q_{i,N-1})$, and the length function $(l_0, l_1, \ldots, l_{N-1})$, our solution tries to find a mapping (permutation) $\pi$ such that:

$$\sum_{k=0}^{N-1} q_{i,k} l_{\pi_i(k)} < \sum_{k=0}^{N-1} q_{i,k} l_{\pi_{i-1}(k)}$$

If no such $\pi_i$ exists, then $\pi_i = \pi_{i-1}$. The above inequality, if possible, can be achieved by swapping a symbol $\alpha$ with another symbol $\beta$, $\alpha \neq \beta$, such that, $\pi_i(\alpha) = \pi_{i-1}(\beta)$ and $\pi_i(\beta) = \pi_{i-1}(\alpha)$ if $q_{i,\alpha} < q_{i,\beta}$ and $l_{\pi_{i-1}(\alpha)} < l_{\pi_{i-1}(\beta)}$ Alternatively, find $\pi_i$ that minimizes $\sum_{k=0}^{N-1} q_{i,k} l_{\pi_i(k)}$ for given $(q_{i,0}, \ldots q_{i,N-1})$ and $(l_0, l_1, \ldots, l_{N-1})$.

Context-Dependent Adaptive Binarization

The dynamic binarizer adaptation may be context-dependent in some embodiments. Let $x^m = x_1 x_2 \ldots x_m$ denote a sequence from alphabet A to be compressed. Suppose an adaptive context modelling scheme with K contexts that for each $x_i$, $1 \leq i \leq m$, derives a context $C_i$ from a context set $\mathcal{T} = \{0, 1, \ldots, K-1\}$, and associates each k, $0 \leq k < K$, with an initial distribution $(q_{0,0|k}, \ldots q_{0,N-1|k})$. In the above, K is a positive integer defined by the context modelling process. An example process to encode and decode $x^m$ by using arithmetic coding along with the above context modelling scheme may be described as follows:

1. Initialize $i=1$, and $n(k)=0$ for all $k=0,1, \ldots K-1$.
2. Derive context $C_i$ for $x_i$ by using the given context modelling process.
3. Encode/Decode $x_i$ by using arithmetic coding with distribution $(q_{n(C_i),0|C_i}, \ldots q_{n(C_i),N-1|C_i})$.
4. Update $(q_{n(C_i),0|C_i}, \ldots q_{n(C_i),N-1|C_i})$ to $(q_{n(C_i),N-1|C_i})$ to $(q_{n(C_i)+1,0|C_i}, \ldots q_{n(C_i)+1,N-1|C_i})$ by including $x_i$.
5. Increase i by 1, and increase $n(C_i)$ by 1.
6. Repeat Steps 2-3 above until i is equal to N.

In Step 4 above, updating the probability distribution may be achieved by using probability estimators including, for example, the Laplace estimator, the Krichevsky-Trofimov (KT) estimator, a finite state model, or their variants.

In Step 3 above, the probability distribution $(q_{n(C_i),0|C_i}, \ldots q_{n(C_i),N-1|C_i})$ associated with context $C_i$ for the i-th symbol $x_i$ may be different from $(q_{n(C_{i-1}),0|C_{i-1}}, \ldots q_{n(C_{i-1}),N-1|C_{i-1}})$, and thus a new binarizer may be used for $x_i$. Let $T_{n(C_i)|C_i}$ denote the binarizer for $x_i$. Then $T_{n(C_i)|C_i}$ might be generated for $x_i$ according to the distribution $(q_{n(C_i),0|C_i}, \ldots q_{n(C_i),N-1|C_i})$, for example, by using the tree construction method described above. Consequently, Step 3 above on the encoder side might be implemented as follows:

3.Ea. Generate a binarizer $T_{n(C_i)|C_i}$ for alphabet A with distribution $(q_{n(C_i),0|C_i}, \ldots q_{n(C_i),N-1|C_i})$, and obtain binary distributions $(p_{n(C_i),0|C_i}, \ldots p_{n(C_i),N-2|C_i})$ at the internal nodes of $T_{n(C_i)|C_i}$.

3.Eb. Convert $x_i$ into a binary string by using the binarizer $T_{n(C_i)|C_i}$.

3.Ec. Encode the binary string by using BAC with $(p_{n(C_i),0|C_i}, \ldots p_{n(C_i),N-2|C_i})$.

On the decoder side, Step 2 above might be implemented as follows:

3.Da. Generate a binarizer $T_{n(C_i)|C_i}$ for alphabet A with distribution $(q_{n(C_i),0|C_i}, \ldots q_{n(C_i),N-1|C_i})$, and obtain binary distributions $(p_{n(C_i),0|C_i}, \ldots p_{n(C_i),N-2|C_i})$ at the internal nodes of $T_{n(C_i)|C_i}$.

3.Db. Decode a binary string by using BAC with $(p_{n(C_i),0|C_i}, \ldots p_{n(C_i),N-2|C_i})$ such that the binary string is a path leading from the root to a leaf node in $T_{n(C_i)|C_i}$.

3.Dc. Decode $x_i$ as the symbol in A associated with the leaf node in $T_{n(C_i)|C_i}$ identified above.

In Step 2.Ea/2.Da above, generating $T_{n(C_i)|C_i}$ might be implemented by updating $T_{n(C_i)-1|C_i}$ if the differences between $(q_{n(C_i),0|C_i}, \ldots q_{n(C_i),N-1|C_i})$ and $(q_{n(C_i)-1,0|C_i}, \ldots q_{n(C_i)-1,N-1|C_i})$ are sparse. For example, if $T_{n(C_i)-1|C_i}$ is a Huffman tree for $(q_{n(C_i)-1,0|C_i}, \ldots q_{n(C_i)-1,N-1|C_i})$, then one can construct $T_{n(C_i)|C_i}$ as a Huffman tree for $(q_{n(C_i),0|C_i}, \ldots q_{n(C_i),N-1|C_i})$. Note that in order to check if $T_{n(C_i)|C_i}$ does not need to be updated, one can check to verify if $T_{n(C_i)-1|C_i}$ satisfies the sibling property for $(q_{n(C_i),0|C_i} \ldots q_{n(C_i),N-1|C_i})$. If the answer is yes, then $T_{n(C_i)|C_i} = T_{n(C_i)-1|C_i}$; otherwise, an update is needed.

To reduce computational complexity involved in generating $T_{n(C_i)|C_i}$, the above-described solution might only update binarizers once every $L>1$ symbols under context $C_i$ are encoded/decoded, or if $(q_{n(C_i),0|C_i}, \ldots q_{n(C_i),N-1|C_i})$ is sufficiently different from $(q_{*,0|C_i}, \ldots q_{*,N-1|C_i})$ which denotes the marginal distribution over A used to generate $T_{n(C_i)-1|C_i}$, i.e. the previous binarizer. The difference between $(q_{n(C_i),0|C_i}, \ldots q_{n(C_i),N-1|C_i})$ and $(q_{*,0|C_i}, \ldots q_{*,N-1|C_i})$ may be measured by using, for example, the $L^p$-norm (examples of p include 1, 2, and $\infty$), the KL divergence, the Hamming distance, or the number of positions at which the sibling property is violated by $T_{n(C_i)-1|C_i}$ for $(q_{n(C_i),0|C_i}, \ldots q_{n(C_i),N-1|C_i})$.

Adaptive Reordering

The dynamic binarizer adaptation may be adapted to alphabet reordering in some embodiments where multi-symbol arithmetic coding is used. Suppose that a fixed search strategy, e.g. linear search as in the CACM decoder, is used in the arithmetic decoder to determine the symbol as the decoder output. Let $x^m = x_1 x_2 \ldots x_m$, denote a sequence from alphabet $A = \{a_0, \ldots a_{N-1}\}$ to be compressed, where the cardinality of A is greater than 2. For this example, presume a probabilistic model that assumes $x^m$ is emitted from a memoryless source with unknown probability distribution over A. Starting with an initial marginal distribution $(q_{1,0}, \ldots q_{1,N-1})$, the model updates the distribution after each symbol is encoded or decoded as described above for adaptive binarization.

Note that the probability distribution $(q_{i,0}, \ldots q_{i,N-1})$ might change after each $x_i$ is encoded or decoded, i.e., $(q_{i,0}, \ldots q_{i,N-1})$ and $(q_{i+1,0}, \ldots q_{i+1,N-1})$ might not be the same. If such a change happens, a new ordering of A might be needed for $x_{i+1}$ to improve the search performance Let $\pi_i$ denote the ordering determined for $x_i$, where $\pi_i(j)$ determines the index of the j-th symbol $a_j$ in A, $j=0, \ldots, N-1$. To adapt the ordering used for each $x_i$, $\pi_i$ might be determined for $x_i$ according to the coding distribution $(q_{i,0}, \ldots q_{i,N-1})$, for example, by placing $a_j$ ahead of $a_l$, $j \neq l$, in the fixed search strategy employed by the decoder if $q_{i,j} > q_{i,l}$. Consequently, Step 2 above on the encoder-side may be implemented as:

3.Ea. Determine a permutation $\pi_i$ for alphabet A according to distribution $(q_{i,0}, \ldots q_{i,N-1})$.

3.Eb. Encode $x_i$ by using the reordered alphabet, i.e. A permuted by using $\pi_i$.

On the decoder side, Step 2 above might be implemented as follows:

3.Da. Determine a permutation $\pi_i$ for alphabet A according to distribution $(q_{i,0}, \ldots q_{i,N-1})$.

3.Db. Decode $x_i$ by using the reordered alphabet, i.e. A permuted by using $\pi_i$, and distribution $(q_{i,0}, \ldots q_{i,N-1})$, or equivalently, its permutation by using $\pi_i$: $(q_{i,\pi_i(0)}, \ldots q_{i,\pi_i(N-1)})$.

In Step 2.Ea/2.Da above, determining $\pi_i$ might be implemented by updating $\pi_{i-1}$ if the differences between $(q_{i,0}, \ldots q_{i,N-1})$ and $(q_{i-1,0}, \ldots q_{i-1,N-1})$ are sparse. For example, assuming that $\pi_{i-1}$ is obtained according to $(q_{i-1,0}, \ldots q_{i-1,N-1})$, $\pi_i$ may be obtained by checking if symbol $x_i$ and the symbols before it in $\pi_{i-1}$ needs to be swapped according to $(q_{i,0} \ldots q_{i,N-1})$.

To reduce computational complexity involved in determining $A_i$ some embodiments may only update the alphabet ordering once every $L>1$ symbols are encoded/decoded, or if $(a_{i,0}, \ldots q_{i,N-1})$ is sufficiently different from $(q_{*,0}, \ldots q_{*,N-1})$ which denotes the marginal distribution over A used to determine $A_{i-1}$.

Finally, the dynamic alphabet reordering may be context-dependent in some embodiments, where the extensions are similar to those described for dynamic binarizer adaptation.

Figure 12:
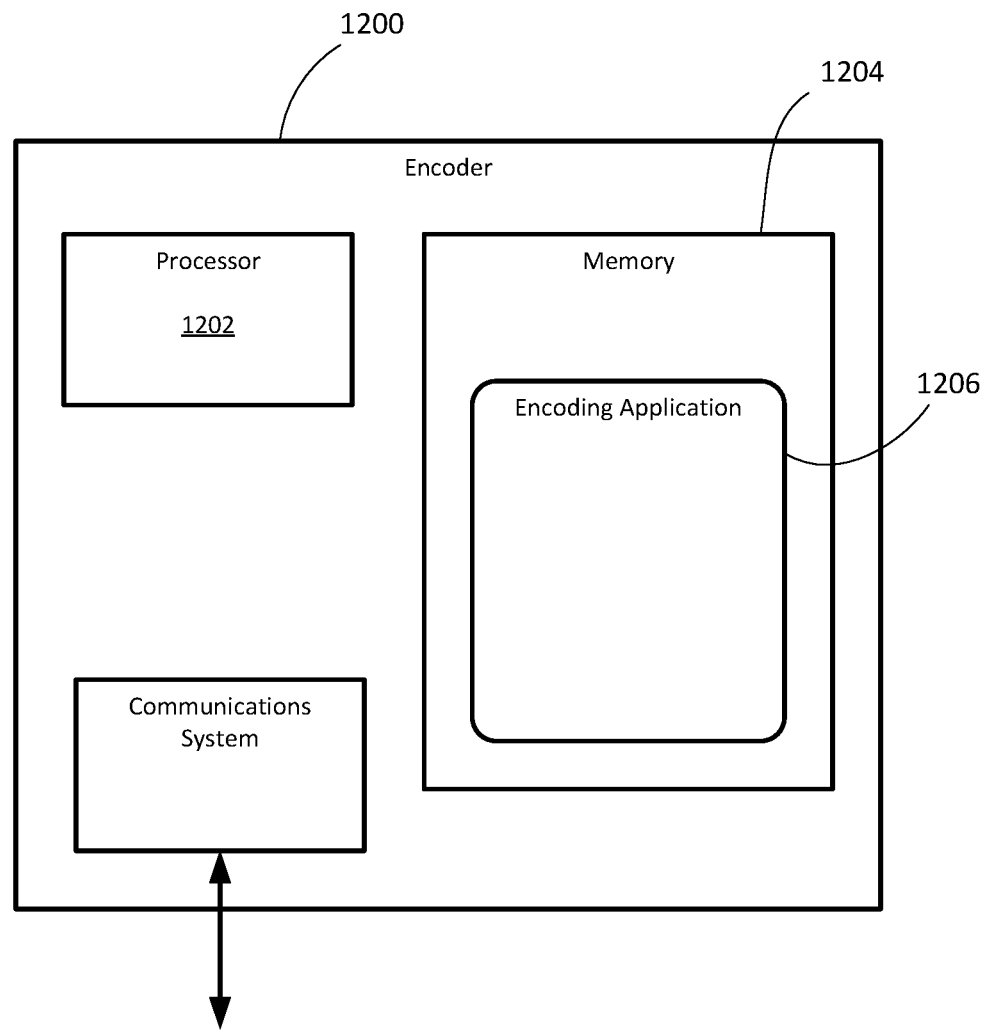
FIG. 12 shows a simplified block diagram of an example embodiment of an encoder.

Reference is now made to FIG. 12, which shows a simplified block diagram of an example embodiment of an encoder 1200. The encoder 1200 includes a processor 1202, memory 1204, and an encoding application 1206. The encoding application 1206 may include a computer program or application stored in memory 1204 and containing instructions that, when executed, cause the processor 1202 to perform operations such as those described herein. For example, the encoding application 1206 may encode and output bitstreams encoded in accordance with the processes described herein. It will be understood that the encoding application 1206 may be stored in on a non-transitory computer-readable medium, such as a compact disc, flash memory device, random access memory, hard drive, etc. When the instructions are executed, the result is configuring the 1202 processor so as to create a special-purpose processor that implements the described process(es). Such a processor may be referred to as a "processor circuit" or "processor circuitry" in some examples.

Figure 13:
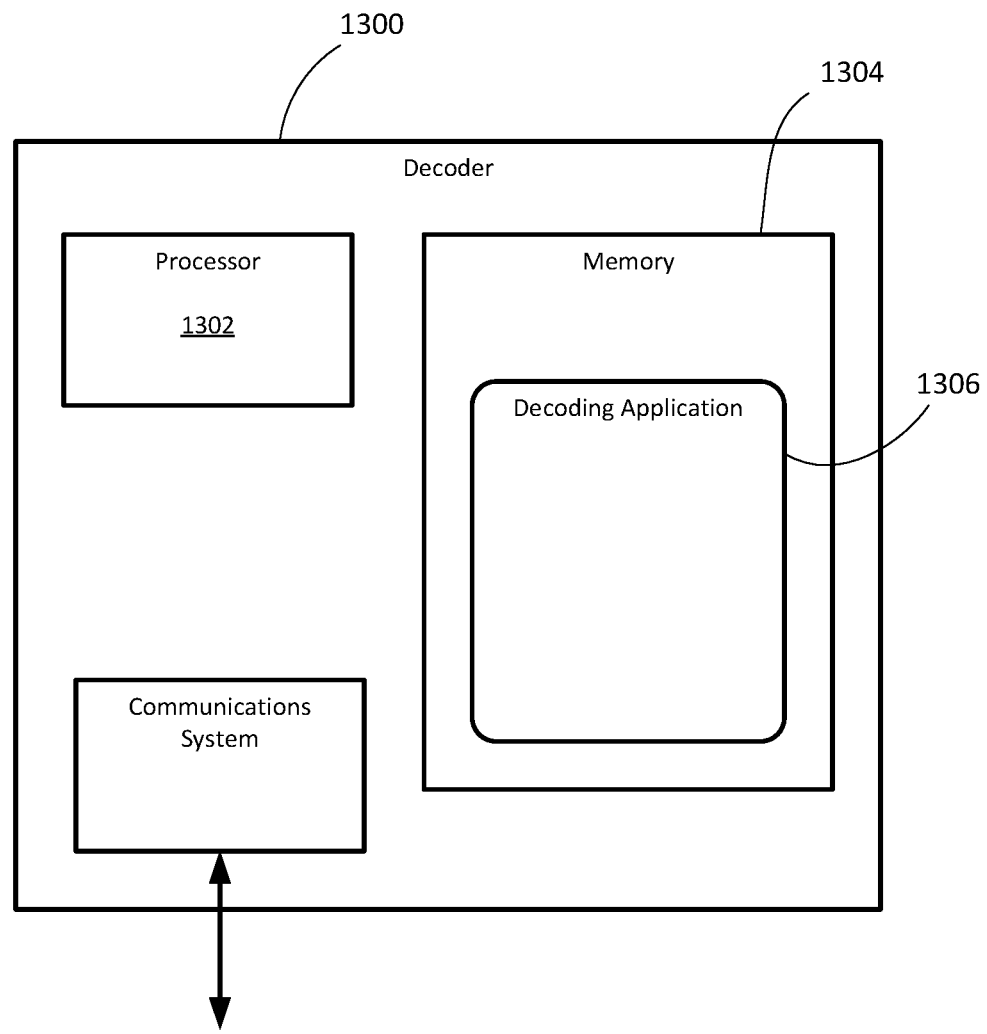
FIG. 13 shows a simplified block diagram of an example embodiment of a decoder.

Reference is now also made to FIG. 13, which shows a simplified block diagram of an example embodiment of a decoder 1300. The decoder 1300 includes a processor 1302, a memory 1304, and a decoding application 1306. The decoding application 1306 may include a computer program or application stored in memory 1304 and containing instructions that, when executed, cause the processor 1302 to perform operations such as those described herein. It will be understood that the decoding application 1306 may be stored in on a computer-readable medium, such as a compact disc, flash memory device, random access memory, hard drive, etc. When the instructions are executed, the result is configuring the 1302 processor so as to create a special-purpose processor that implements the described process (es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, audio/video encoding and playback devices, set-top television boxes, television broadcast equipment, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method of decoding an image in a video or image decoder from a bitstream, the decoder having an arithmetic decoder to convert the bitstream into bins, and the decoder having a binarizer constructed based on a probability distribution associated with an alphabet of symbols, the method comprising:
    inverse binarizing, using the binarizer, a sequence of bins arithmetically decoded from the bitstream and corresponding to an encoded symbol from the alphabet of symbols, to produce a reconstructed symbol;
    updating the probability distribution based on the reconstructed symbol to produce an updated probability distribution;
    determining an updated binarizer based on the updated probability distribution for use in inverse binarizing a second sequence of bins to produce a second reconstructed symbol; and
    outputting the reconstructed symbols to be used in reconstructing the image.

2. The method claimed in claim 1, further comprising updating the updated probability distribution based on the second reconstructed symbol to produce a further updated probability distribution for use in determining a further updated binarizer.

3. The method claimed in claim 1, further comprising repeating the operations of inverse binarizing, updating, and determining, for subsequent encoded symbols.

4. The method claimed in claim 1, further comprising determining that the binarizer is to be updated, and wherein the determination is based upon determining that the updated probability distribution is different from the probability distribution by more than a threshold amount.

5. The method claimed in claim 1, further comprising determining that the binarizer is to be updated, and wherein the determination is based upon determining that more than a threshold number of symbols have been decoded since the binarizer was last updated.

6. The method claimed in claim 1, wherein the binarizer comprises a coding tree, and wherein determining the updated binarizer comprises constructing a new coding tree based upon the updated probability distribution associated with the alphabet of symbols, and wherein the symbols are assigned to respective leaf nodes of the updated coding tree.

7. The method claimed in claim 1, further comprising first determining a context for the encoded symbol and selecting the binarizer based on its association with the context determined for the encoded symbol, and wherein the probability distribution and the updated probability distribution are associated with the context determined for the encoded symbol.

8. The method claimed in claim 1, wherein the operation of determining the updated binarizer comprises selecting the updated binarizer from a set of pre-constructed binarizers.

9. The method claimed in claim 1, wherein the binarizer comprises a coding tree, and wherein the operation of determining the updated binarizer comprises modifying the coding tree to produce an updated coding tree.

10. A decoder for decoding an image from a bitstream, the bitstream having header information for a set of blocks, the decoder comprising:
    a processor;
    memory storing a probability distribution associated with an alphabet of symbols;
    an arithmetic decoder to convert the bitstream into bins;
    a binarizer constructed based on the probability distribution to inverse binarize a sequence of bins arithmetically decoded from the bitstream and corresponding to an encoded symbol from the alphabet of symbols, to produce a reconstructed symbol;
    a probability generator to update the probability distribution based on the reconstructed symbol to produce an updated probability distribution; and
    a binarizer generator to generate a updated binarizer based on the probability distribution;
    the updated binarizer to inverse binarize a second sequence of bins to produce a second reconstructed symbol,
    wherein the reconstructed symbols are output to be used in reconstructed the image.

11. The decoder claimed in claim 10, wherein the probability generator is to update the updated probability distribution based on the second reconstructed symbol to produce a further updated probability distribution for use in generating a further updated binarizer.

12. The decoder claimed in claim 10, wherein the decoder is to repeat the operations of inverse binarizing, updating and generating for subsequent encoded symbols.

13. The decoder claimed in claim 10, wherein the binarizer generator is to further determine that the updated binarizer is to be generated, and wherein the determination is to be based upon determining that the updated probability distribution is different from the probability distribution by more than a threshold amount.

14. The decoder claimed in claim 10, wherein the binarizer generator is to further determine that the updated binarizer is to be generated, and wherein the determination is to be based upon determining that more than a threshold number of symbols have been decoded since the binarizer was last updated.

15. The decoder claimed in claim 10, wherein the binarizer comprises a coding tree, and wherein the binarizer generator is to generate the updated binarizer by constructing a new coding tree based upon the updated probability distribution associated with the alphabet of symbols, and wherein the symbols are assigned to respective leaf nodes of the updated coding tree.

16. The decoder claimed in claim 10, further comprising a context generator to determine a context for the encoded symbol and to select the binarizer based on its association with the context determined for the encoded symbol, and wherein the probability distribution and the updated probability distribution are associated with the context determined for the encoded symbol.

17. The decoder claimed in claim 10, wherein the memory is to store a set of pre-constructed binarizers, and wherein the binarizer generator is to generate the updated binarizer by selecting the updated binarizer from among the set of pre-constructed binarizers.

18. The decoder claimed in claim 10, wherein the binarizer comprises a coding tree, and wherein the binarizer generator is to generate the updated binarizer by modifying the coding tree to produce an updated coding tree.

19. A non-transitory processor-readable medium storing processor-executable instructions for decoding an image in a video or image decoder from a bitstream, the decoder having an arithmetic decoder to convert the bitstream into bins, and the decoder having a binarizer constructed based on a probability distribution associated with an alphabet of symbols, wherein the processor-executable instructions comprise:

instructions to inverse binarize, using the binarizer, a sequence of bins arithmetically decoded from the bitstream and corresponding to an encoded symbol from the alphabet of symbols, to produce a reconstructed symbol;

instructions to update the probability distribution based on the reconstructed symbol to produce an updated probability distribution;

instructions to determine an updated binarizer based on the updated probability distribution for use in inverse binarizing a second sequence of bins to produce a second reconstructed symbol; and instructions to output the reconstructed symbols to be used in reconstructing the image.

20. A method of encoding an image within an image or video encoder to generate a bitstream of encoded data, the encoder having an arithmetic encoder to convert bins into the bitstream of encoded data, and the encoder having a binarizer constructed based on a probability distribution associated with an alphabet of symbols, the method comprising:

binarizing, using the binarizer, a symbol from the image to produce a sequence of bins;

arithmetically encoding the sequence of bins to generate the bitstream;

updating the probability distribution based on the symbol to produce an updated probability distribution; and determining an updated binarizer based on the updated probability distribution for use in binarizing a second symbol to produce a second sequence of bins.

* * * * *